(12) United States Patent
Miura

(10) Patent No.: US 8,888,300 B2
(45) Date of Patent: Nov. 18, 2014

(54) ILLUMINATION UNIT HAVING AT LEAST TWO SOLID STATE LIGHT SOURCES IN THE SAME WAVELENGTH BAND

(75) Inventor: Koji Miura, Tokyo (JP)

(73) Assignee: Sony Corporation, Tokyo (JP)

( * ) Notice: Subject to any disclaimer, the term of this patent is extended or adjusted under 35 U.S.C. 154(b) by 251 days.

(21) Appl. No.: 13/281,553

(22) Filed: Oct. 26, 2011

(65) Prior Publication Data

US 2012/0133901 A1 May 31, 2012

(30) Foreign Application Priority Data

Nov. 29, 2010 (JP) .................................. 2010-265379

(51) Int. Cl.
| | |
|---|---|
| *G03B 21/00* | (2006.01) |
| *G03B 21/26* | (2006.01) |
| *F21V 9/00* | (2006.01) |
| *G02B 27/14* | (2006.01) |
| *H04N 9/31* | (2006.01) |
| *G03B 21/20* | (2006.01) |
| *H01S 5/40* | (2006.01) |
| *G02B 27/10* | (2006.01) |
| *H01S 5/022* | (2006.01) |
| *G03B 33/06* | (2006.01) |

(52) U.S. Cl.
CPC .......... *G03B 21/2013* (2013.01); *G02B 27/145* (2013.01); *H01S 5/4093* (2013.01); *H04N 9/3164* (2013.01); *H04N 9/3161* (2013.01); *G02B 27/1033* (2013.01); *H01L 2224/48091* (2013.01); *G03B 21/2033* (2013.01); *H01S 5/02212* (2013.01); *G03B 33/06* (2013.01); *G02B 27/1053* (2013.01)
USPC .................. 353/94; 353/31; 353/85; 362/230; 362/231

(58) Field of Classification Search
CPC .......... G03B 21/2013; G03B 21/2033; H04N 9/3161; H04N 9/3164; H01S 5/4087; H01S 3/08086; F21K 9/00; F21Y 2101/02; F21Y 2101/025; G02B 27/145
USPC ............... 353/30–31, 33, 39, 81, 85, 94, 122; 362/230–231, 236, 259, 553, 555; 372/23
See application file for complete search history.

(56) References Cited

U.S. PATENT DOCUMENTS

| | | | |
|---|---|---|---|
| 6,648,475 B1 * | 11/2003 | Roddy et al. ..................... | 353/31 |
| 6,905,217 B2 * | 6/2005 | Childers et al. .................. | 353/94 |
| 7,360,900 B2 * | 4/2008 | Sakata et al. ..................... | 353/20 |

(Continued)

FOREIGN PATENT DOCUMENTS

| | | |
|---|---|---|
| JP | 62-043620 | 2/1987 |
| JP | 2008-134324 | 6/2008 |

(Continued)

OTHER PUBLICATIONS

Japanese Office Action issued May 27, 2014 in corresponding Japanese Patent Application No. 2010-265379.

*Primary Examiner* — Georgia Y Epps
*Assistant Examiner* — Jori S Reilly-Diakun
(74) *Attorney, Agent, or Firm* — K&L Gates LLP

(57) ABSTRACT

An illumination unit includes a plurality of light sources each including a solid-state light-emitting device configured to emit light from a light emission region including a single or a plurality of light-emitting spots. The solid-state light-emitting device includes a single chip or a plurality of chips each emitting light beam. Three or more of the light-emitting spots are provided within the whole light sources, to allow the whole light sources to emit light beams in two or more wavelength bands different from one another. Two or more of the plurality of light sources include respective light-emitting spots which emit light in the same wavelength band.

15 Claims, 22 Drawing Sheets

(56) References Cited

U.S. PATENT DOCUMENTS

| | | | |
|---|---|---|---|
| 7,411,722 B2* | 8/2008 | Kowarz | 359/298 |
| 7,766,490 B2* | 8/2010 | Harbers et al. | 353/94 |
| 7,857,456 B2* | 12/2010 | Liao et al. | 353/31 |
| 7,905,605 B2* | 3/2011 | Bierhuizen et al. | 353/31 |
| 7,938,541 B2* | 5/2011 | Mizushima et al. | 353/31 |
| 2004/0207821 A1* | 10/2004 | Roddy et al. | 353/94 |
| 2006/0007406 A1* | 1/2006 | Adkins et al. | 353/82 |
| 2006/0203204 A1 | 9/2006 | Yu | |
| 2007/0070304 A1* | 3/2007 | Sakata | 353/94 |
| 2007/0070305 A1* | 3/2007 | Sakata | 353/94 |
| 2010/0309439 A1* | 12/2010 | Bi et al. | 353/33 |
| 2012/0188458 A1* | 7/2012 | Imai et al. | 348/571 |
| 2012/0224146 A1* | 9/2012 | Katou | 353/20 |

FOREIGN PATENT DOCUMENTS

| | | |
|---|---|---|
| JP | 2010-160444 | 7/2010 |
| JP | 2010-166023 | 7/2010 |
| WO | WO99/49358 | 9/1999 |
| WO | WO2009/139865 | 11/2009 |

* cited by examiner

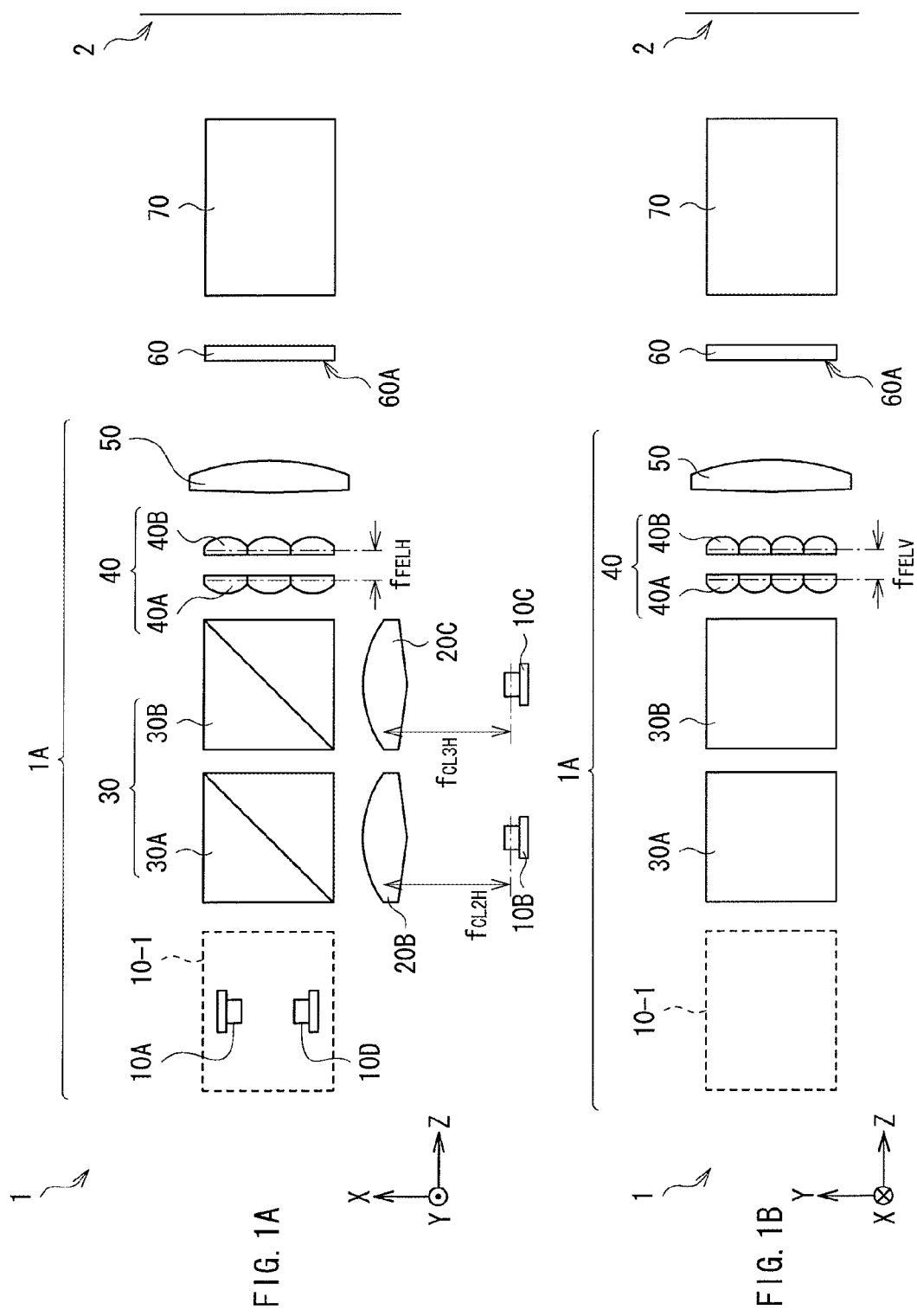

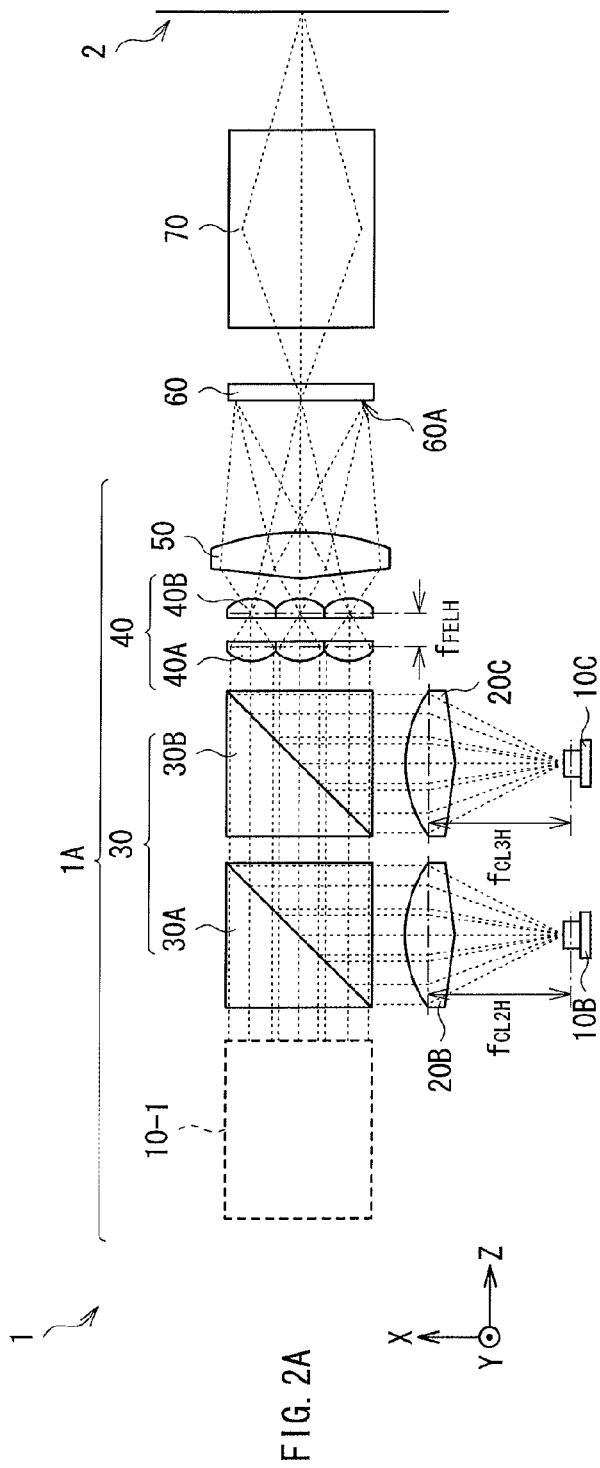
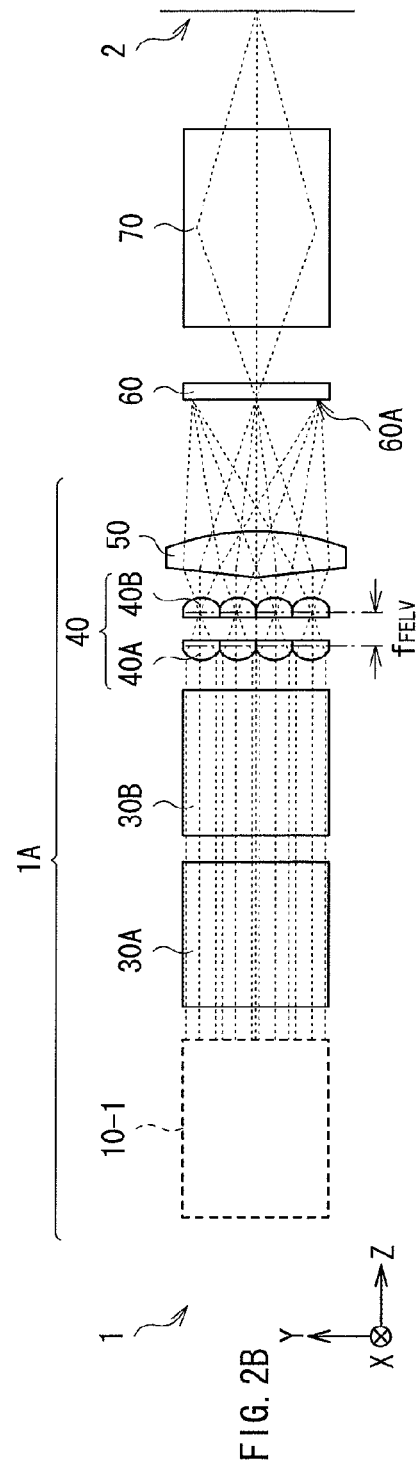
FIG. 2A
FIG. 2B

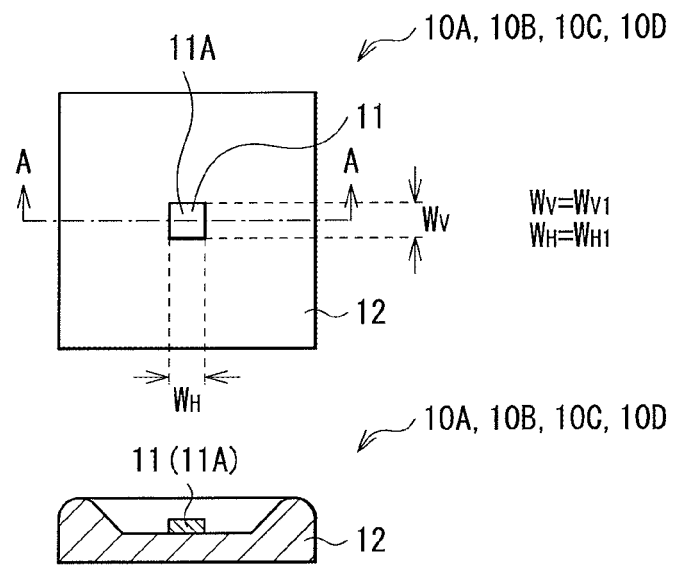
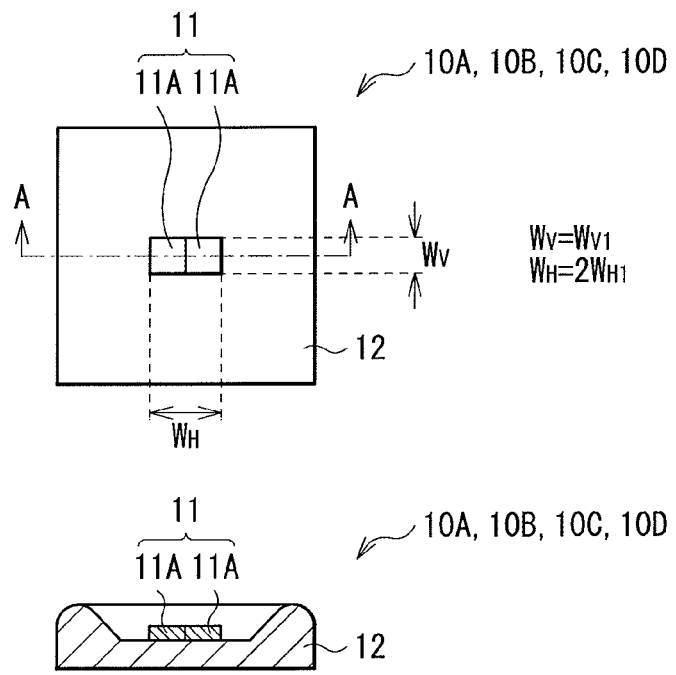

$P_V = P_{V1}$
$P_H = P_{H1}$ $P_{V1} = P_V < W_V$
$2P_{H1} < P_H < W_H$ $2P_{V1} < P_V < W_V$
$2P_{H1} < P_H < W_H$ $W_V = W_{V1}$
$W_H \geqq 3W_{H1}$ $W_V \geq 3W_{V1}$
$W_H = W_{H1}$ $W_V \geqq 2W_{V1}$
$W_H = W_{H1}$ $W_V = W_{V1}$
$W_H = W_{H1}$ $W_V \geqq 2W_{V1}$
$W_H = W_{H1}$

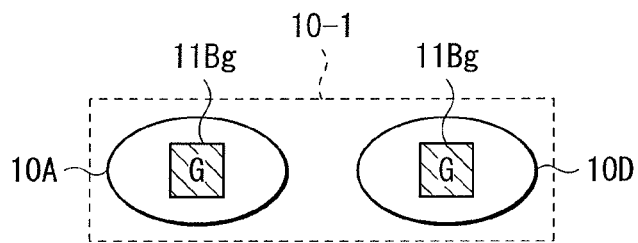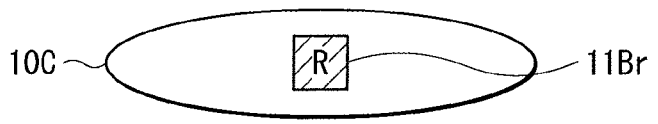
FIG. 15A
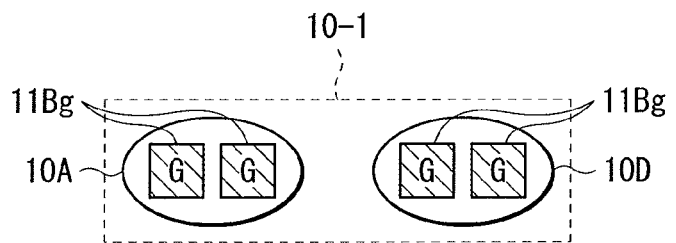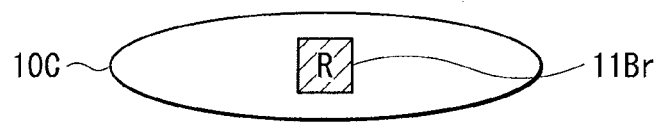
FIG. 15B

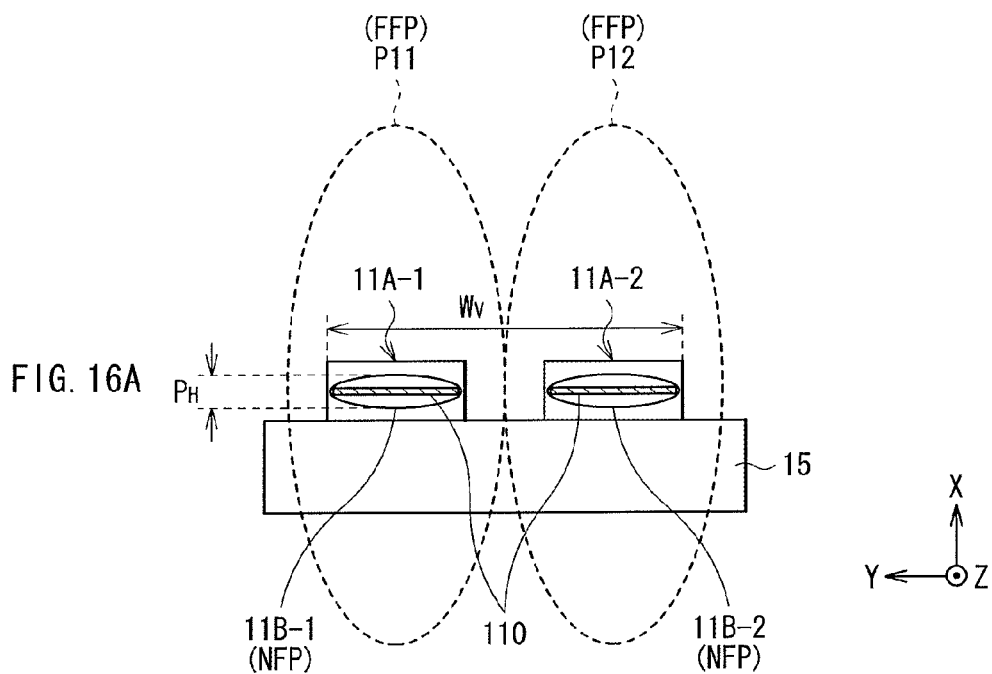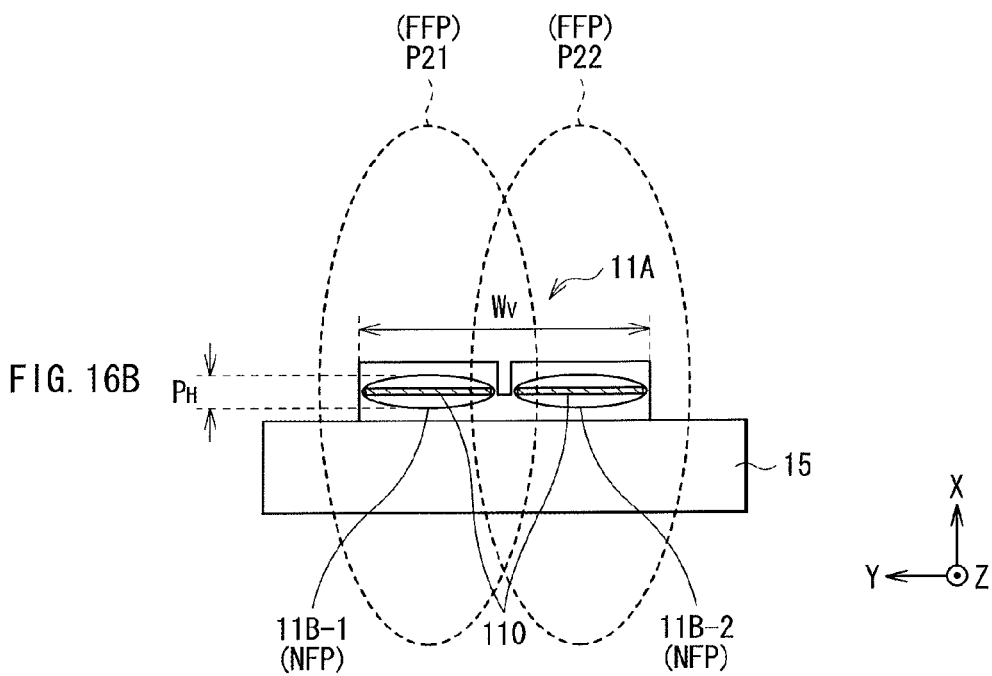

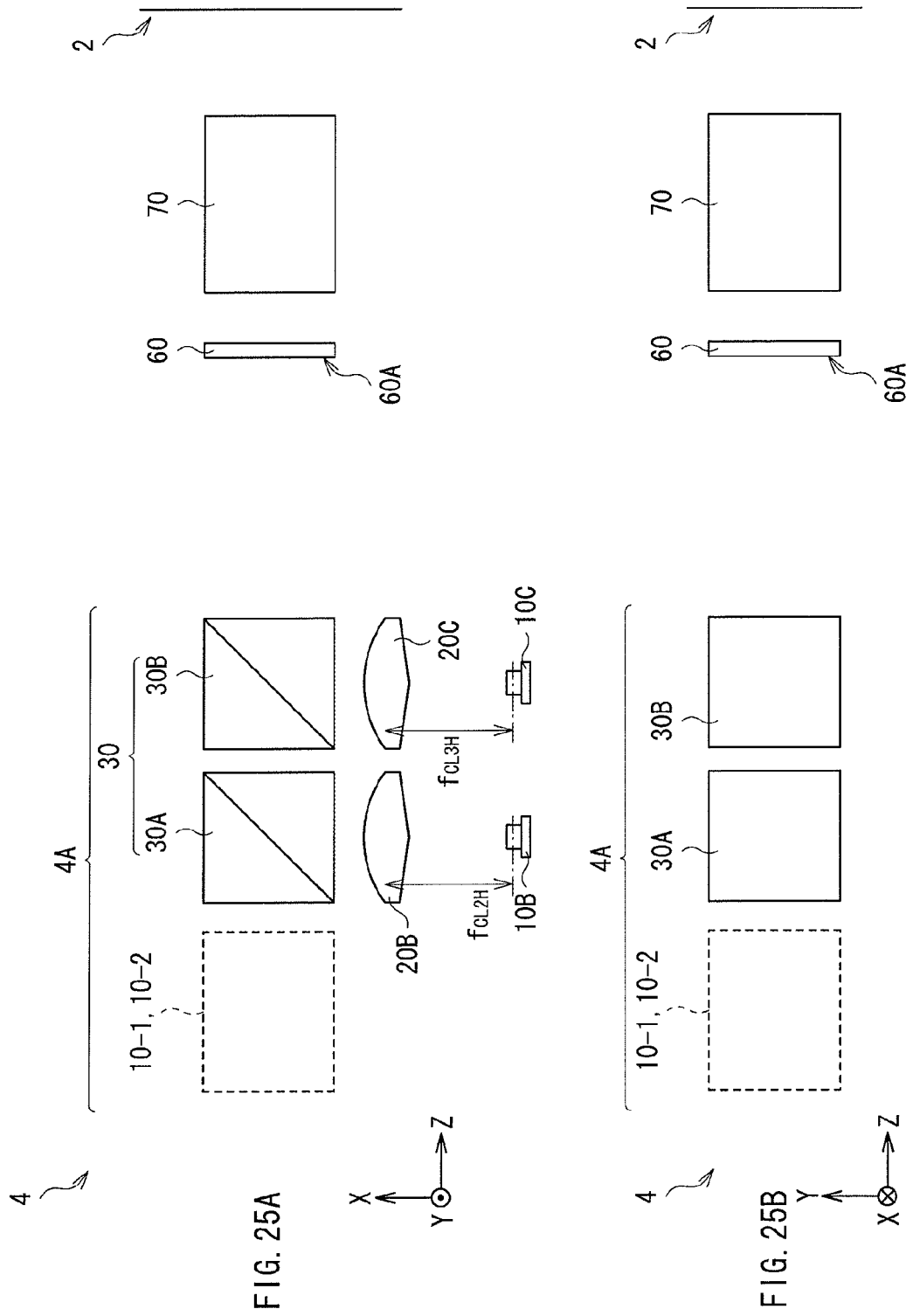

ILLUMINATION UNIT HAVING AT LEAST TWO SOLID STATE LIGHT SOURCES IN THE SAME WAVELENGTH BAND

CROSS REFERENCES TO RELATED APPLICATIONS

The present application claims priority to Japanese Patent Application No. 2010-265379 filed on Nov. 29, 2010, the disclosure of which is incorporated herein by reference.

BACKGROUND

The present disclosure relates to an illumination unit using a solid-state light-emitting device such as a laser diode (LD), and a projection display unit and a direct view display unit including the same.

In recent years, a projector to project a picture on a screen is used widely not only in offices but also in households. The projector generates image light by modulating light from a light source with a light bulb and produces a display by projecting the image light on a screen. Recently, a palm-size microprojector, a mobile telephone incorporating a microprojector, etc., begin to spread (for example, see Japanese Unexamined Patent Application Publication No. 2008-134324).

SUMMARY

As a light source used in a projector, a high-luminance discharge lamp is the mainstream. However, the discharge lamp has a comparatively large size and a large power consumption, and therefore, a solid-state light-emitting device, such as a light-emitting diode LED), laser diode (LD), and organic EL (OLED), has attracted attention recently as a light source in place of the discharge lamp. These solid-state light-emitting devices are more advantageous not only in size and power consumption but also in high reliability than the discharge lamp.

Here, in such a projector, a color display is performed generally by using light of the three primary colors, that is, red (R), green (G), and blue (B). In a device (chip within a solid-state light-emitting device) configured to emit each primary color light, the light emission intensity (luminance) may differ from color to color, and in such a case, it is difficult to make an attempt to improve the luminance of the illumination light (irradiation light), as a whole, from an illumination unit. This is because when, for example, the light emission intensity of one color (for example, G) of the three primary colors is relatively lower than the light emission intensity of the other two colors (for example, R, B), it is necessary to make an adjustment based on the relatively lower light emission intensity if an attempt is made to adjust white balance of the illumination light as a whole. In such circumstances, proposal of a technique to improve luminance of illumination light has been desired.

It is desirable to provide an illumination unit capable of improving luminance of illumination light, and a projection display unit and a direct view display unit using such an illumination unit.

An illumination unit according to an embodiment of the present disclosure includes: a plurality of light sources each including a solid-state light-emitting device configured to emit light from a light emission region including a single or a plurality of light-emitting spots, wherein the solid-state light-emitting device includes a single chip or a plurality of chips each emitting light beam, three or more of the light-emitting spots are provided within the whole light sources, to allow the whole light sources to emit light beams in two or more wavelength bands different from one another, and two or more of the plurality of the light sources include respective light-emitting spots which emit light in the same wavelength band.

A projection display unit according to an embodiment of the present disclosure includes: an illumination optical system; a spatial modulation device modulating light from the illumination optical system based on an input picture signal to generate imaging light; and a projection optical system projecting the imaging light generated by the spatial modulation device, the illumination optical system including a plurality of light sources each including a solid-state light-emitting device configured to emit light from a light emission region including a single or a plurality of light-emitting spots, wherein the solid-state light-emitting device includes a single chip or a plurality of chips each emitting light beam, three or more of the light-emitting spots are provided within the whole light sources, to allow the whole light sources to emit light beams in two or more wavelength bands different from one another, and two or more of the plurality of the light sources include respective light-emitting spots which emit light in the same wavelength band.

A direct view display unit according to an embodiment of the present disclosure includes: an illumination optical system; a spatial modulation device modulating light from the illumination optical system based on an input picture signal to generate imaging light; a projection optical system projecting the imaging light generated by the spatial modulation device; and a transmissive screen displaying the imaging light projected from the projection optical system, the illumination optical system including a plurality of light sources each including a solid-state light-emitting device configured to emit light from a light emission region including a single or a plurality of light-emitting spots, wherein the solid-state light-emitting device includes a single chip or a plurality of chips each emitting light beam, three or more of the light-emitting spots are provided within the whole light sources, to allow the whole light sources to emit light beams in two or more wavelength bands different from one another, and two or more of the plurality of the light sources include respective light-emitting spots which emit light in the same wavelength band.

In the illumination unit, the projection display unit, and the direct view display unit according to the embodiments of the present disclosure, the three or more of the light-emitting spots are provided within the whole light sources, to allow the whole light sources to emit the light beams in two or more wavelength bands different from one another, and the two or more of the plurality of the light sources include the respective light-emitting spots which emit the light in the same wavelength band. Thus, it is possible to adjust relative light emission intensities between the light of the respective wavelength bands when the illumination unit emits the light beams in two or more wavelength bands as illumination light.

Advantageously, the illumination unit, the projection display unit, and the direct view display unit each further include one or more traveling-direction angle conversion device each converting a traveling-direction-angle of the light entering from the solid-state light-emitting device; and an integrator uniformalizing illumination distribution in a predetermined illumination region which is to be illuminated by light from the traveling-direction angle conversion device. Further advantageously, the integrator includes a first fly-eye lens having cells which receive light from the traveling-direction angle conversion device, and a second fly-eye lens having cells which receive light from the first fly-eye lens, and an optical system configured with the traveling-direction angle conversion device and the first and second fly-eye lenses has an optical magnification which allows each of light source images to have a size not exceeding a size of the cell in the second fly-eye lens, the light source images being formed on the second fly-eye lens by the respective cells in the first fly-eye lens. In this embodiment, the light incident on the second fly-eye lens reaches the illumination region efficiently. Thus, it is unlikely that one light source image is formed across a plurality of cells, making it possible to improve light use efficiency of the illumination unit.

According to the illumination unit, the projection display unit, and the direct view display unit of the embodiments of the present disclosure, the three or more of the light-emitting spots are provided within the whole light sources, to allow the whole light sources to emit the light beams in two or more wavelength bands different from one another, and the two or more of the plurality of the light sources include the respective light-emitting spots which emit the light in the same wavelength band. This makes it possible to adjust relative light emission intensities between the light of the respective wavelength bands when the illumination unit emits the light beams in two or more wavelength bands as illumination light. Therefore, it is possible to improve luminance of the illumination light.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 1A and 1B are diagrams each representing an outline configuration of a projector according to a first embodiment of the present disclosure.

FIGS. 2A and 2B are diagrams each showing an example of an optical path within the projector in FIGS. 1A and 1B.

FIGS. 4A and 4B are diagrams showing examples of a top surface configuration and a section configuration when a chip is a top surface light-emitting device in the light source in FIGS. 1A and 1B, respectively.

FIGS. 5A and 5B are diagrams showing other examples of a top surface configuration and a section configuration when the chip is a top surface light-emitting device in the light source in FIGS. 1A and 1B, respectively.

FIGS. 15A and 15B are schematic diagrams each showing an arrangement configuration example of a light-emitting sport of each color light in each light source in FIGS. 1A and 1B.

FIGS. 16A and 16B are diagrams each showing an example of a relationship between an arrangement configuration of the light-emitting spot in the light source in FIGS. 1A and 1B and FFP.

FIGS. 25A and 25B are diagrams representing an outline configuration of a projector according to modification 2.

DETAILED DESCRIPTION

Embodiments of the present application will be described below in detail with reference to the drawings. The description is given in the following order.

1. First embodiment (example in which a prism is used as an optical path unifying section within a light source unit)
2. Second embodiment (example in which a dichroic prism, a phase-difference plate array, etc., are used as an optical path unifying section within a light source unit)
3. Modifications
 Modification 1 (example in which a reflection type device is used as a spatial modulation device)
 Modification 2 (example in which an integrator and a condenser lens are omitted from an illumination optical system)
 Other modifications (application example to a rear projection display unit etc.)

First Embodiment

General Configuration of Projector 1

FIGS. 1A and 1B represent an outline configuration of a projector (projector 1) according to a first embodiment of the present disclosure. This projector 1 corresponds to a specific example of a "projection display unit" in one embodiment of the present disclosure. FIG. 1A represents a configuration example when the projector 1 is viewed from above (in a y-axis direction) and FIG. 1B represents a configuration example when the projector 1 is viewed from a lateral side (in an x-axis direction). FIGS. 2A and 2B represent an example of an optical path within the projector 1 in FIGS. 1A and 1B.

Figure 3:
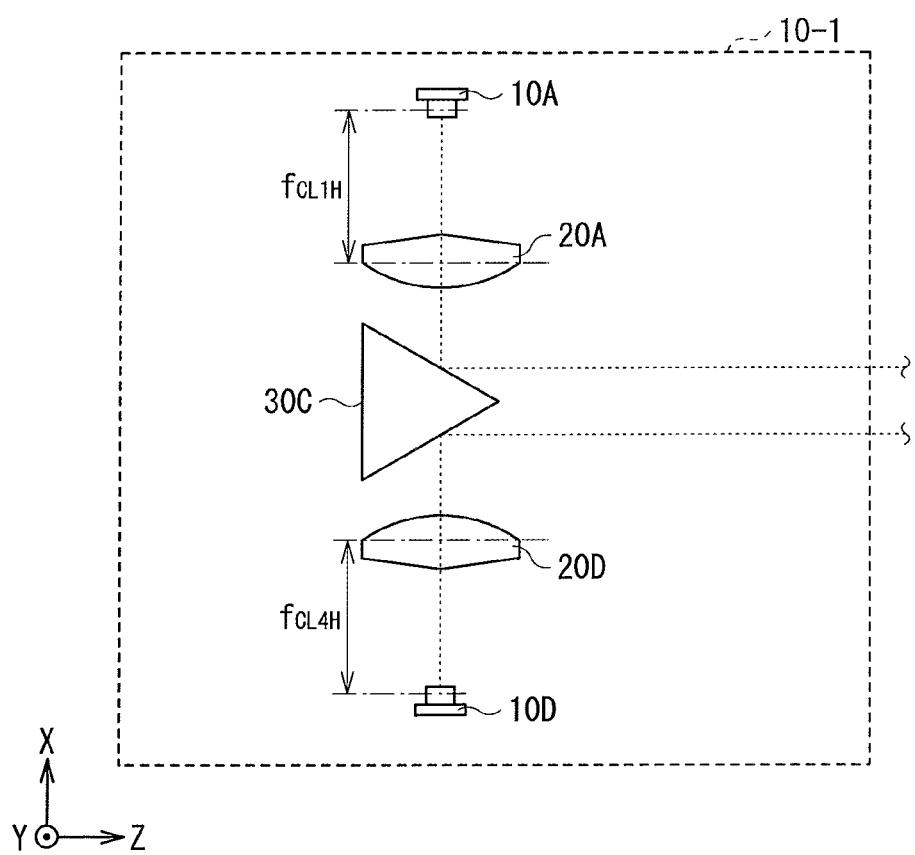
FIG. 3 is a diagram showing an example of a detailed configuration of a light source unit in FIGS. 1A and 1B.

FIG. 2A represents an example of an optical path when the projector 1 is viewed from above (in the y-axis direction) and FIG. 2B represents an example of an optical path when the projector 1 is viewed from the lateral side (in the x-axis direction). Further, FIG. 3 represents a detailed configuration example of a light source unit 10-1, to be described later, shown in FIGS. 1A, 1B, 2A, and 2B.

Typically, the y axis faces in the vertical direction and the x axis in the horizontal direction, however, conversely, the y axis may face in the horizontal direction and the x axis in the vertical direction. In the following, for the sake of convenience, the description is given on the assumption that the y axis face in the vertical direction and the x axis in the horizontal direction. In the following, the "horizontal direction" refers to the x-axis direction and the "vertical direction" the y-axis direction.

The projector 1 includes, for example, an illumination optical system 1A, a spatial modulation device 60 configured to generate image light (imaging light) by modulating light from the illumination optical system 1A based on an input picture signal, and a projection optical system 70 configured to project the image light generated in the spatial modulation device 60 onto a reflection type screen 2. Here, the illumination optical system 1A corresponds to a specific example of the "illumination unit" in one embodiment of the present disclosure.

[Configuration of Illumination Optical System 1A]

The illumination optical system 1A supplies a light flux with which an illumination region 60A (surface to be irradiated) of the spatial modulation device 60 is irradiated. Optionally, it may also be possible to provide some optical device on a region through which light of the illumination optical system 1A passes. For example, it may also be possible to provide a filter etc. configured to attenuate light other than the visible light of light from the illumination optical system 1A on the region through which light of the illumination optical system 1A passes.

The illumination optical system 1A has, for example, the light source unit 10-1 including two light sources 10A and 10D, two light sources 10B and 10C, coupling lenses (traveling-direction angle conversion devices) 20B and 20C, an optical path unifying device 30, an integrator 40, and a condenser lens 50 as shown in FIGS. 1A and 1B. The light source unit 10-1 has coupling lenses 20A and 20D (traveling-direction angle conversion devices) and a prism 30C in addition to the light sources 10A and 10D described above as shown in FIG. 3 for example. The prism 30C corresponds to a specific example of an "optical path unifying section" in one embodiment of the present disclosure.

The prism 30C unifies light from the two light sources 10A and 10D within the light source unit 10-1. The optical path unifying device 30 unifies light from the light source unit 10-1 (light for which optical path unification is performed after it is emitted from the light sources 10A and 10D, respectively) and light from the light sources 10B and 10C, and includes, for example, two dichroic mirrors 30A and 30B. The integrator 40 makes uniform the illuminance distribution of light in the illumination region 60A, and includes, for example, a pair of fly-eye lenses 40A and 40B.

The coupling lens 20A, the prism 30C, the optical path unifying device 30, the integrator 40, and the condenser lens 50 are arrayed on the optical axis of the light source 10A in this order from the side of the light source 10A. The coupling lens 20D, the prism 30C, the optical path unifying device 30, the integrator 40, and the condenser lens 50 are arrayed on the optical axis of the light source 10D in this order from the side of the light source 10A. The optical axis of the light source 10B intersects the optical axis of the light sources 10A and 10D at the dichroic mirror 30A. The coupling lens 20B and the dichroic mirror 30A are arrayed on the optical axis of the light source 10B in this order from the side of the light source 10B. The optical axis of the light source 10C intersects the optical axis of the light sources 10A and 10D at the dichroic mirror 30B. The coupling lens 20C and the dichroic mirror 30B are arrayed on the optical axis of the light source 10C in this order from the side of the light source 10C. Here, among these, the coupling lenses (traveling-direction angle conversion devices) 20A, 20B, 20C, and 20D and the integrator 40 correspond to a specific example of an "optical member (an optical member through which light incident from the side of a solid-state light-emitting device, to be described later, passes and exits) in one embodiment of the present disclosure.

FIGS. 1A and 1B illustrate a case where each component (excluding the light sources 10B and 10C and the coupling lenses 20B and 20C) of the projector 1 is arrayed on a segment in parallel with the z axis, however, part of each component of the projector 1 may be arrayed on a segment not in parallel with the z axis. For example, although not shown, the illumination optical system 1A may be laid out so as to cause the optical axis of the illumination optical system 1A to face in a direction perpendicular to the z axis by rotating the whole of the illumination optical system 1A by 90 degrees from the state in FIGS. 1A and 1B. However, in such a case, it may be necessary to provide an optical device (for example, a mirror) configured to guide light output from the illumination optical system 1A to the spatial modulation device 60. Further, for example, the light source unit 10-1 and the optical path unifying device 30 may be laid out so as to cause these optical axes to face in a direction perpendicular to the z axis by rotating the light source 10A, the coupling lens 20A, and the optical path unifying device 30 by 90 degrees from the state in FIGS. 1A and 1B. However, in such a case also, it may be necessary to provide an optical device (for example, a mirror) configured to guide light output from the optical path unifying device 30 to the integrator 40.

[Light Sources 10A, 10B, 10C, 10D: When Chip 11A is Top Surface Light-Emitting Device]

Figure 6A:
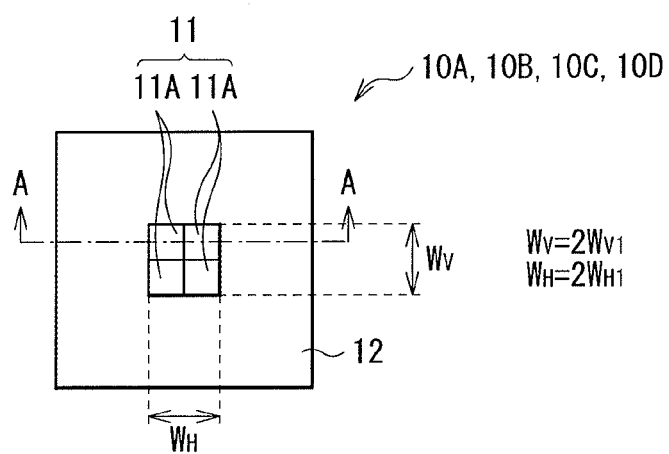
FIGS. 6A and 6B are diagrams showing still other examples of a top surface configuration and a section configuration when the chip is a top surface light-emitting device in the light source in FIGS. 1A and 1B, respectively.
Figure 6B:
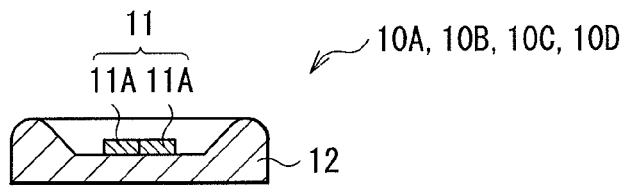

The light sources 10A, 10B, 10C, and 10D each have, for example, a solid-state light-emitting device 11 and a package 12 (substrate to mount the solid-state light-emitting device 11) to support the solid-state light-emitting device 11 as shown in FIGS. 4A and 4B to FIGS. 6A and 6B. In other words, each of the light sources 10A, 10B, 10C, and 10D functions as a package to support the solid-state light-emitting device 11 on the substrate. The solid-state light-emitting device 11 is configured to emit light from a light emission region including a single or a plurality light-emitting spots in the shape of a point or not in the shape of a point. The solid-state light-emitting device 11 may include, for example, a single chip 11A configured to emit light in a predetermined wavelength band as shown in FIGS. 4A and 4B or may include, for example, a plurality of the chips 11A configured to emit light in the same wavelength band or wavelength bands different from one anther as shown in FIGS. 5A and 5B and FIGS. 6A and 6B. When the solid-state light-emitting device 11 includes a plurality of the chips 11A, these chips 11A may be arranged, for example, in a line in the horizontal direction as shown in FIGS. 5A and 5B or, for example, in the form of a lattice in the horizontal direction and in the vertical direction as shown in FIGS. 6A and 6B. The numbers of the chips 11 included in the solid-state light-emitting device 11 may be different in the light sources 10A, 10B, 10C, and 10D, or may be the same in all the light sources 10A, 10B, 10C, and 10D.

When the solid-state light-emitting device 11 includes the single chip 11A, a size ($W_V \times W_H$) as the solid-state light-emitting device 11 is, for example, equal to a size ($W_{V1} \times W_{H1}$) of the single chip 11A as shown in FIG. 4A. On the other hand, when the solid-state light-emitting device 11 includes a plurality of the chips 11A, the size as the solid-state light-emitting device 11 is, for example, equal to the size when all the chips 11A are gathered into one as shown in FIG. 5A and FIG. 6A. When a plurality of the chips 11A is arranged in a line in the horizontal direction, the size ($W_V \times W_H$) as the solid-state light-emitting device 11 is $W_{V1} \times 2W_{H1}$ in the example in FIG. 5A. When a plurality of the chips 11A is arranged in the form of a lattice in the horizontal direction and in the vertical direction, the size ($W_V \times W_H$) as the solid-state light-emitting device 11 is $2W_{V1} \times 2W_{H1}$ in the example in FIG. 6A.

The chip 11A includes a light-emitting diode (LED), an organic EL light-emitting device (OLED), or a laser diode (LD). All the chips 11A included in each of the light sources 10A, 10B, 10C, and 10D may be configured by LED, OLED, or LD. It may also be possible for the chip 11A included in at least one light source of the light sources 10A, 10B, 10C, and 10D to be configured by LED and for the chips 11A included in the other light sources to be configured by OLED. Further, it may also be possible for the chip 11A included in at least one light source of the light sources 10A, 10B, 10C, and 10D to be configured by LED and for the chips 11A included in the other light sources to be configured by LD. Furthermore, it may also be possible for the chip 11A included in at least one light source of the light sources 10A, 10B, 10C, and 10D to be configured by OLED and for the chips 11A included in the other light sources to be configured by LD. However, it is desirable that at least one of the chips 11A be configured by LD in the light sources 10A, 10B, 10C, and 10D as a whole.

The chip 11A included in each of the light sources 10A, 10B, 10C, and 10D is configured to, for example, emit light in wavelength bands different from one another in the light sources 10A and 10D, in the light source 10B, and in the light source 10C. The chips 11A included in the light sources 10A and 10D are configured to emit light having a wavelength of, for example, about 400 nm to 500 nm (blue light). The chip 11A included in the light source 10B is configured to emit light having a wavelength of, for example, about 500 nm to 600 nm (green light). The chip 11A included in the light source 10C is configured to emit light having a wavelength of, for example, about 600 nm to 700 nm (red light). The chip 11A included in the light sources 10A and 10D may be configured to emit light other than blue light (that is, green light or red light). Further, the chip 11A included in the light sources 10B may be configured to emit light other than green light (that is, blue light or red light). Furthermore, the chip 11A included in the light sources 10C may be configured to emit light other than red light (that is, green light or blue light). A specific example of the color of light emitted from each chip 11A (each color light-emitting spot) included in each of the light sources 10A, 10B, 10C, and 10D is described later (FIGS. 15A to 15C etc.).

The chip 11A has, for example, a light-emitting spot 11B having a size ($P_{V1} \times P_{H1}$) smaller than the size ($W_V \times W_H$) of the chip 11A as shown in FIGS. 4A and 4B to FIGS. 7A, 7B, and 7C. The light-emitting spot 11B corresponds to a region (light emission region) where light is emitted from the chip 11A when an electric current is injected into the chip 11A to drive the chip 11A. When the chip 11A includes LED or OLED, the light-emitting spot 11B is not in the shape of a point (in the shape of a plane), however, when the chip 11A includes LD, the light-emitting spot 11B is in the shape of a point smaller than that of the light-emitting spot 11B including LED or OLED.

Figure 7A:
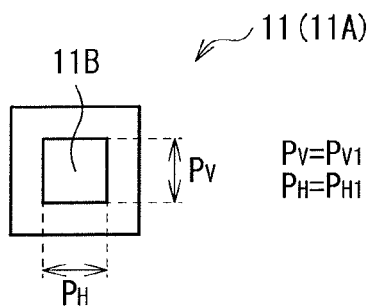
FIGS. 7A to 7C are diagrams each showing an example of a light-emitting spot when the chip is a top surface light-emitting device in the light source in FIGS. 1A and 1B.
Figure 7B:
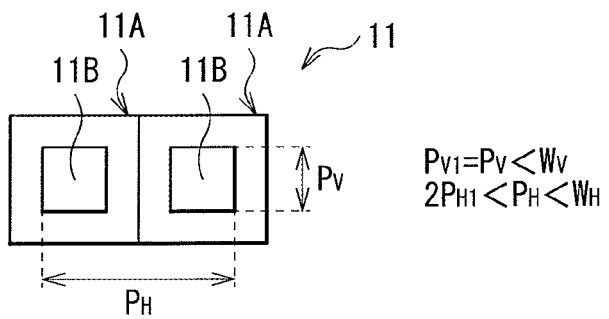
Figure 7C:
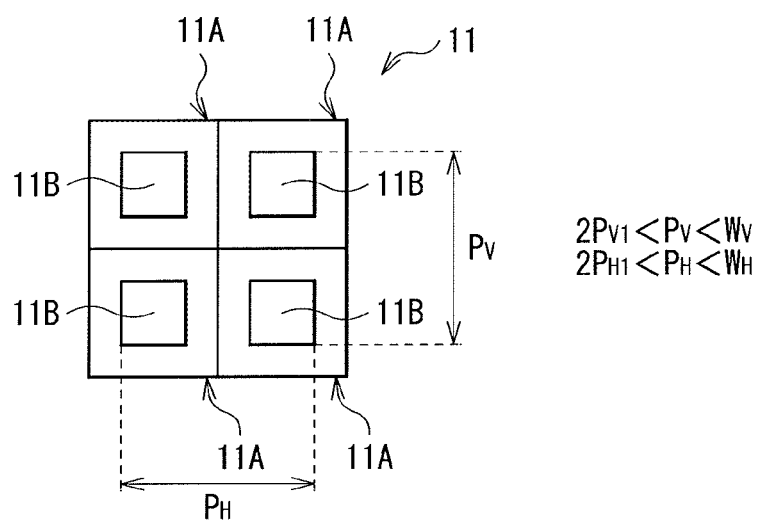
Figure 8A:
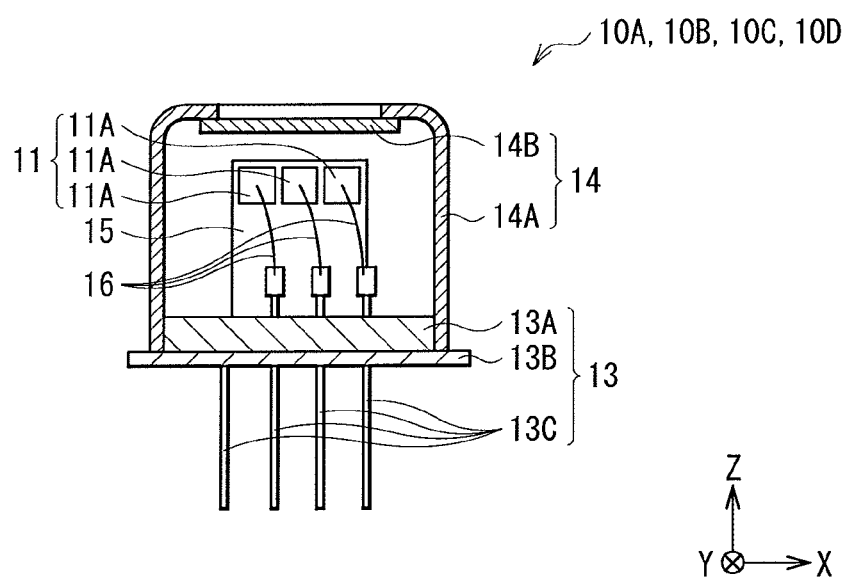
FIGS. 8A and 8B are diagrams showing examples of a section configuration and a configuration when a solid-state light-emitting device is viewed from the side of a light emission surface when the chip is an end surface light-emitting device in the light source in FIGS. 1A and 1B, respectively.
Figure 8B:
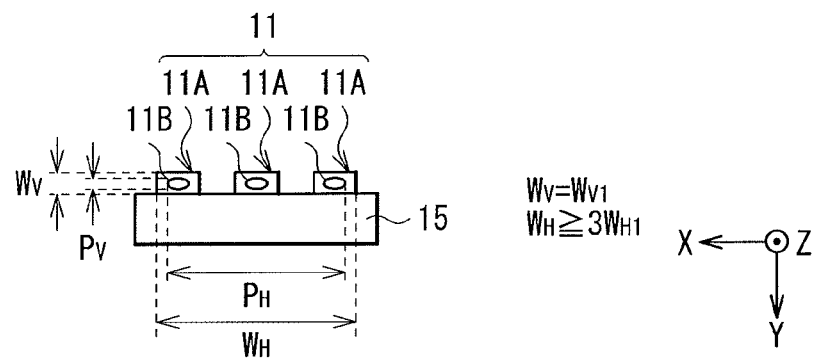
Figure 9A:
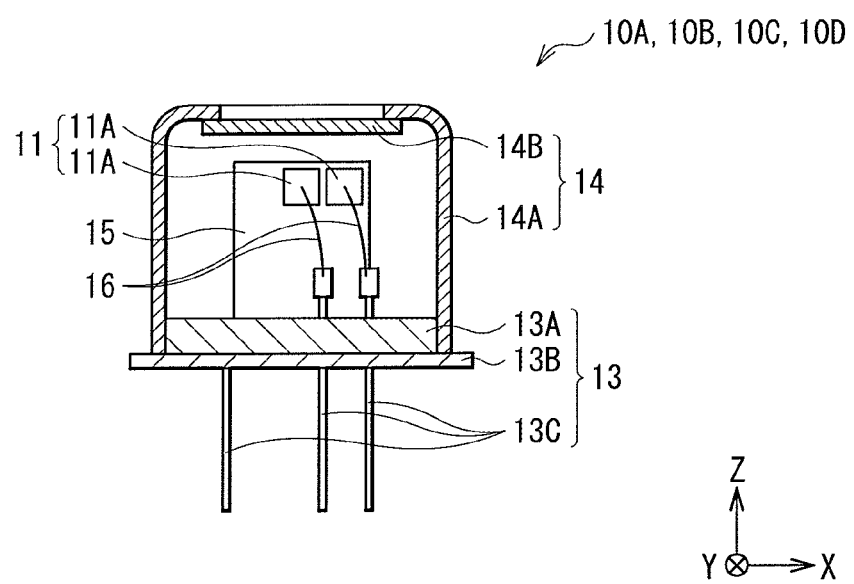
FIGS. 9A and 9B are diagrams showing other examples of a section configuration and a configuration when a solid-state light-emitting device is viewed from the side of a light emission surface when the chip is an end surface light-emitting device in the light source in FIGS. 1A and 1B, respectively.
Figure 9B:
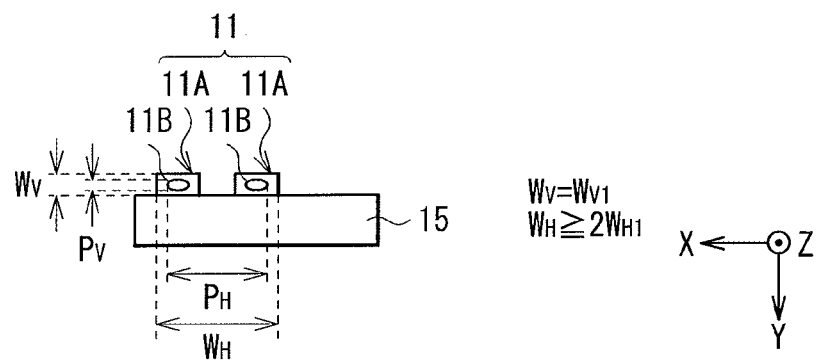

When the solid-state light-emitting device 11 includes the single chip 11A, the number of the light-emitting spots 11B is, for example, one as shown in FIG. 7A. However, when the solid-state light-emitting device 11 has a monolithic structure, as will be described later, the number of the light-emitting spots 11B is two or more, and this applies to the following. On the other hand, when the solid-state light-emitting device 11 includes a plurality of the chips 11A, the number of the light-emitting spots 11B is, for example, equal to the number of the chips 11A as shown in FIGS. 7B and 7C (however, when the solid-state light-emitting device 11 has a monolithic structure as described above, the number of the light-emitting spots 11B is larger than the number of the chips 11A). Here, when the solid-state light-emitting device 11 includes the single chip 11A, the size ($P_V \times P_H$) of the light emission region as the solid-state light-emitting device 11 is equal to the size ($P_{V1} \times P_{H1}$) of the light-emitting spot 11B (however, the case where the solid-state light-emitting device 11 has a monolithic structure as described above is excluded). On the other hand, when the solid-state light-emitting device 11 includes a plurality of the chips 11A, the size ($P_V \times P_H$) of the light emission region as the solid-state light-emitting device 11 is equal to a size of an enclosure when the light-emitting spots 11B of all the chips 11A are enclosed with a minimum area. When a plurality of the chips 11A is arranged in a line in the horizontal direction, the size ($P_V \times P_H$) of the light emission region is larger than $P_{V1} \times 2P_{H1}$ and smaller than $W_V \times W_H$ in the example in FIG. 7B. When a plurality of the chips 11A is arranged in the form of a lattice in the horizontal direction and in the vertical direction, the size ($P_V \times P_H$) of the light emission region is larger than $2P_{V1} \times 2P_{H1}$ and smaller than $W_V \times W_H$ in the example in FIG. 7C.

[Light Sources 10A, 10B, 10C, 10D: When Chip 11A is End Surface Light-Emitting Device]

Here, in FIGS. 4A and 4B to FIGS. 7A to 7B, the case is illustrated, where the chip 11A is a top surface light-emitting device, however, the chip 11A may be an end surface light-emitting device as will be explained below. In such a case, the light sources 10A, 10B, 10C, and 10D each have, for example, a can-type configuration in which the solid-state light-emitting device 11 including one or a plurality of end surface light-emitting chips 11A is accommodated in an inner space enclosed by a stem 13 and a cap 14 as shown in FIGS. 8A and 8B to FIGS. 13A, 13B, and 13C. In other words, here, each of the light sources 10A, 10B, 10C, and 10D is a package incorporating the solid-state light-emitting device 11.

The stem 13 constitutes, together with the cap 14, the package of each of the light sources 10A, 10B, 10C, and 10D. The stem 13 has, for example, a support substrate 13A configured to support a submount 15, an outer frame substrate 13B arranged on the back surface of the support substrate 13A, and a plurality of connection terminals 13C.

The submount 15 includes a material having conductivity and heat dissipation properties. The support substrate 13A and the outer frame substrate 13B are each a substrate having conductivity and heat dissipation properties in which one or a plurality of insulating through-holes and one or a plurality of conductive through-holes are formed. The support substrate 13A and the outer frame substrate 13B have the shape of, for example, a circular plate and are stacked with the center axes (not shown schematically) of both overlapping each other. The diameter of the outer frame substrate 13B is made greater than the diameter of the support substrate 13A. The outer edge of the outer frame substrate 13B forms an annular flange bulging out radially from the center axis of the outer frame substrate 13B in the plane the normal of which is the center axis of the outer frame substrate 13B. The flange plays a role to define a reference position when inserting and fitting the cap 14 into the support substrate 13A in the manufacturing process.

The plurality of the connection terminals 13C penetrates through at least the support substrate 13A. The terminal(s) (hereinafter, referred to as a "terminal a" for the sake of convenience) of the plurality of the connection terminals 13C, from which at least one terminal is excluded, is electrically connected to the electrode (not shown schematically) of each of the chips 11A one by one. For example, the terminal a protrudes considerably on the side of the outer frame substrate 13B and protrudes slightly on the side of the support substrate 13A. The terminal(s) (hereinafter, referred to as a "terminal β" for the sake of convenience) other than the terminal a of the plurality of the connection terminals 13C is electrically connected to the other electrode (not shown schematically) of all the chips 11A. For example, the terminal β protrudes considerably on the side of the outer frame substrate 13B and the end edge on the side of the support substrate 13A of the terminal β is embedded within, for example, the support substrate 13A. The part of each connection terminal 13C, which protrudes considerably on the side of the outer frame substrate 13B, corresponds to the part to be inserted into, for example, a substrate etc. On the other hand, the part of the plurality of the connection terminals 13C, which protrudes slightly on the side of the support substrate 13A, corresponds to the part to be electrically connected with each of the chips 11A one by one via a wire 16. The part of the plurality of the connection terminals 13C, which is embedded within the support substrate 13A, corresponds to the part to be electrically connected with all the chips 11A via, for example, the support substrate 13A and the submount 15. The terminal α is supported by the insulating through-hole provided in the support substrate 13A and the outer frame substrate 13B, and insulated and separated from the support substrate 13A and the outer frame substrate 13B by the through-hole. Further, each terminal α is insulated and separated from one another by the above-mentioned insulating member. On the other hand, the terminal β is supported by the conductive through-hole provided in the support substrate 13A and the outer frame substrate 13B and electrically connected with the through-hole.

The cap 14 is configured to seal the solid-state light-emitting device 11. The cap 14 has, for example, a cylinder section 14A, in the upper end and lower end of which an opening is provided. The lower end of the cylinder section 14A comes into contact with the side surface of the support substrate 13A and the solid-state light-emitting device 11 is located in the inner space of the cylinder section 14A. The cap 14 has a light transmission window 14B arranged so as to block the opening on the side of the upper end of the cylinder section 14A. The light transmission window 14B is arranged in a position in opposition to the light emission surface of the solid-state light-emitting device 11 and has a function of transmitting light output from the solid-state light-emitting device 11.

As described above, when the chip 11A includes an end surface light-emitting device, the solid-state light-emitting device 11 is configured to emit light from a light emission region including a single or a plurality of light-emitting spots in the shape of a point or not in the shape of a point. The solid-state light-emitting device 11 may include, for example, the single chip 11A configured to emit light in a predetermined wavelength band, or may include a plurality of the chips 11A configured to emit light in the same wavelength band, or may include a plurality of the chips 11A configured to emit light in wavelength bands different from one another. When the solid-state light-emitting device 11 includes a plurality of the chips 11A, those chips 11A are arranged, for example, in a line in the horizontal direction as shown in FIGS. 8A and 8B and FIGS. 9A and 9B or arranged, for example, in a line in the vertical direction as shown in FIGS. 11A and 11B and FIGS. 12A and 12B. The numbers of the chips 11A included in the solid-state light-emitting device 11 may differ from one another in the light sources 10A, 10B, 10C, and 10D or may be the same in all the light sources 10A, 10B, 10C, and 10D.

Figure 10A:
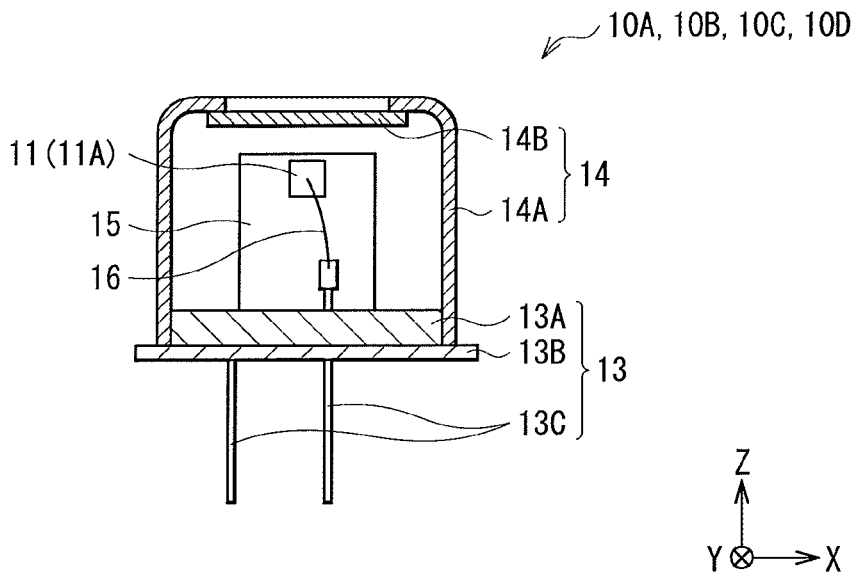
FIGS. 10A to 10C are diagrams showing still other examples of a section configuration and a configuration when a solid-state light-emitting device is viewed from the side of a light emission surface when the chip is an end surface light-emitting device in the light source in FIGS. 1A and 1B.
Figure 10B:
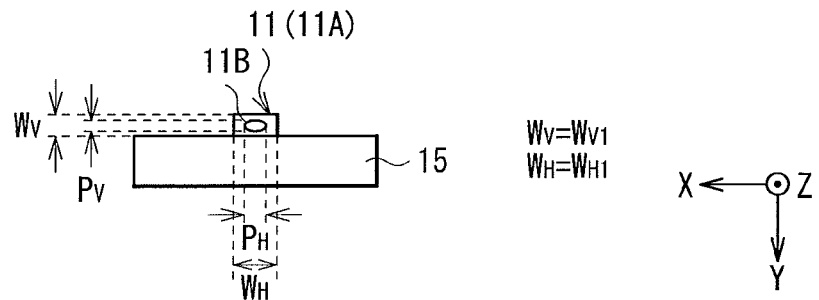
Figure 10C:
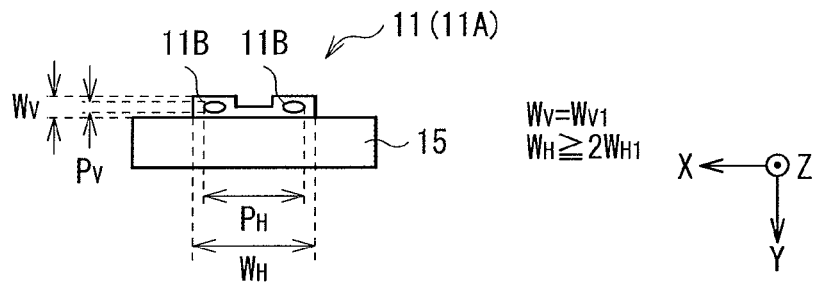
Figure 11A:
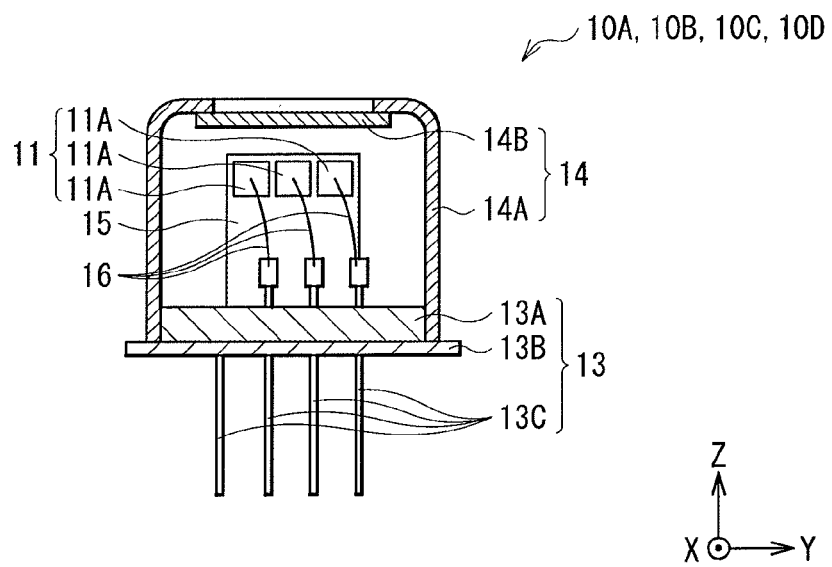
FIGS. 11A and 11B are diagrams each showing a configuration example when a light source in FIGS. 7A to 7C is rotated by 90 degrees in an XY plane.
Figure 11B:
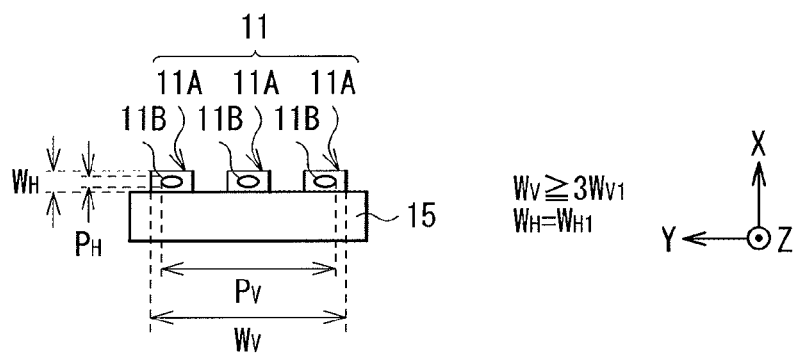
Figure 12A:
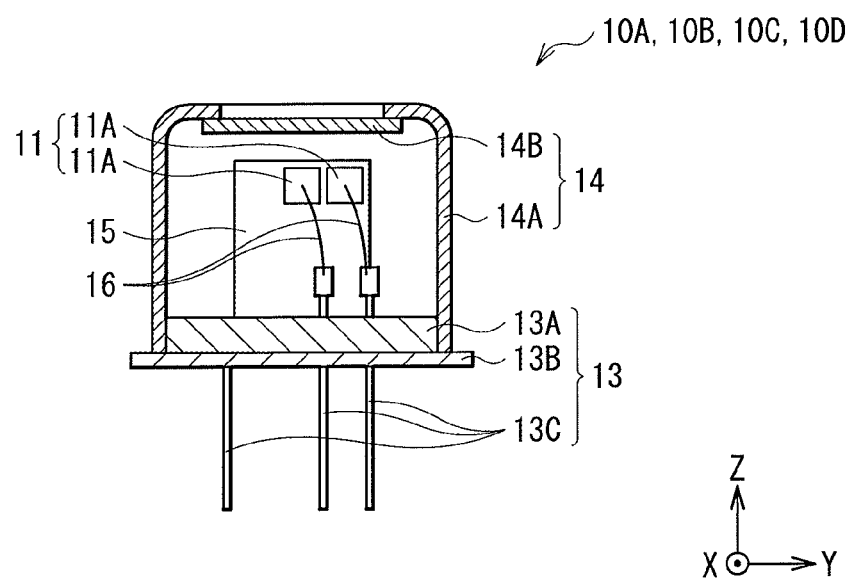
FIGS. 12A and 12B are diagrams each showing a configuration example when a light source in FIGS. 8A and 8B is rotated by 90 degrees in an XY plane.
Figure 12B:
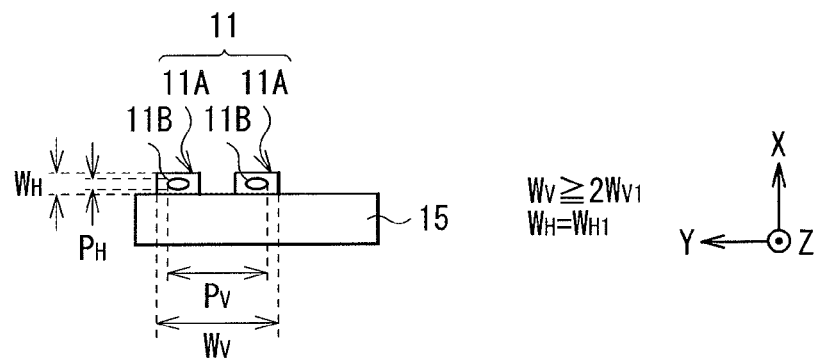
Figure 13A:
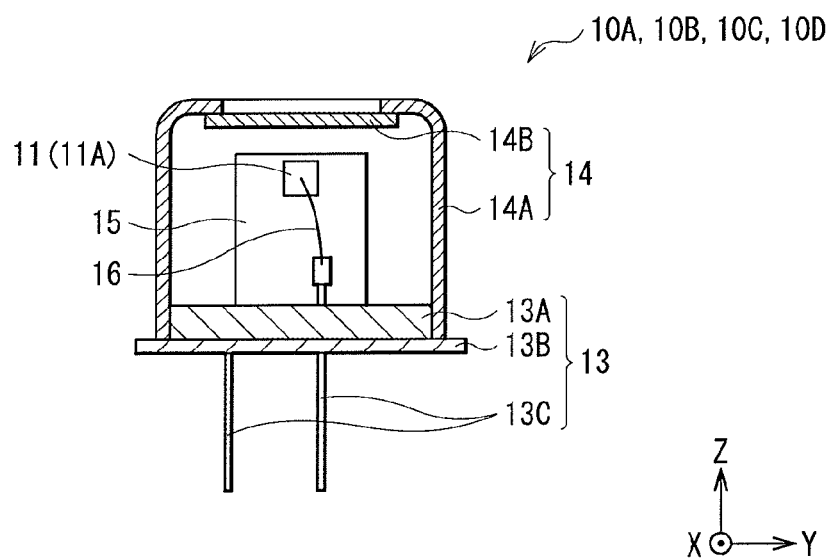
FIGS. 13A to 13C are diagrams each showing a configuration example when a light source in FIGS. 9A and 9C is rotated by 90 degrees in an XY plane.
Figure 13B:
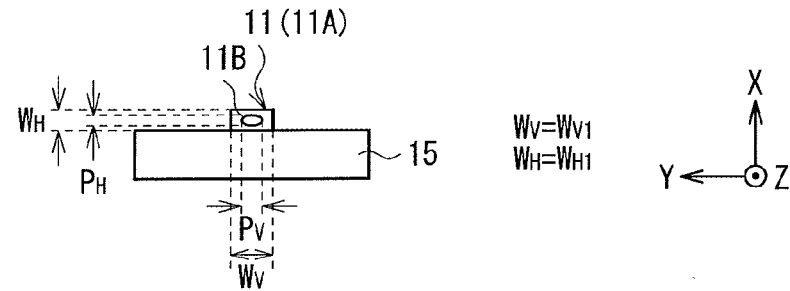
Figure 13C:
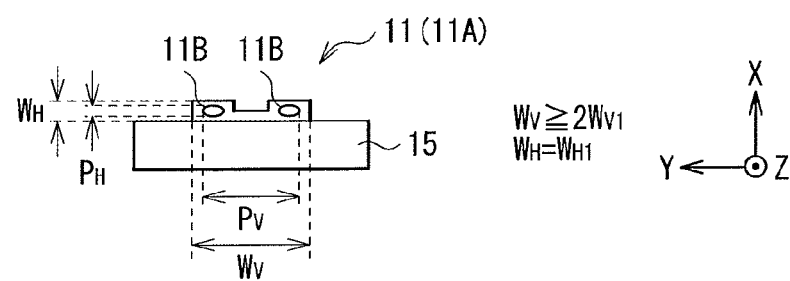

When the solid-state light-emitting device 11 includes the single chip 11A, the size ($W_V \times W_H$) as the solid-state light-emitting device 11 is, for example, equal to the size ($W_{V1} \times W_{H1}$) of the single chip 11A as shown in FIG. 10B and FIG. 13B. However, when the solid-state light-emitting device 11 has a monolithic structure as shown in, for example, FIG. 10C and FIG. 13C, the sizes are as follows and this applies to the following. That is, in the example in FIG. 10C, the size ($W_V \times W_H$) as the solid-state light-emitting device 11 is larger than $W_{V1} \times 2W_{H1}$ and in the example in FIG. 13C, the size ($W_V \times W_H$) as the solid-state light-emitting device 11 is larger than $2W_{V1} \times W_{H1}$. On the other hand, when the solid-state light-emitting device 11 includes a plurality of the chips 11A, the size as the solid-state light-emitting device 11 is, for example, equal to the size when all the chips 11A are gathered into one as shown in FIG. 8B, FIG. 9B, FIG. 11B, and FIG. 12B. When the plurality of the chips 11A is arranged in a line in the horizontal direction, the size ($W_V \times W_H$) as the solid-state light-emitting device 11 is larger than $W_{V1} \times 3W_{H1}$ in the example in FIG. 8B and larger than $W_{V1} \times 2W_{H1}$ in the example in FIG. 9B. When a plurality of the chips 11A is arranged in a line in the vertical direction, the size ($W_V \times W_H$) as the solid-state light-emitting device 11 is larger than $3W_{V1} \times W_{H1}$ in the example in FIG. 11B and larger than $2W_{V1} \times W_{H1}$ in the example in FIG. 12B.

The chip 11A includes, for example, a laser diode (LD). All the chips 11A included in each of the light sources 10A, 10B, 10C, and 10D may include LD. Alternatively, the chips 11A included in at least one light source of the light sources 10A, 10B, 10C, and 10D may include LD and the chips 11A included in the other light sources may include LED or OLED. In this case also, however, it is desirable for at least one of the chips 11A to include LD in the light sources 10A, 10B, 10C, and 10D as a whole.

The chip 11A has, for example, the light-emitting spot 11B the size ($P_{V1} \times P_{H1}$) of which is smaller than the size ($W_V \times W_H$) of the chip 11A as shown in FIGS. 8A and 8B to FIGS. 16A, 16B, and 16C. The light-emitting spot 11B corresponds to the region (light emission region) in which light is emitted from the chip 11A when an electric current is injected into the chip 11A to drive the chip 11A. When the chip 11A includes LD, the light-emitting spot 11B is in the shape of a point smaller than that of the light-emitting spot including LED or OLED.

When the solid-state light-emitting device 11 includes the single chip 11A, the number of the light-emitting spots 11B is, for example, one as shown in FIG. 10A and FIG. 13B. However, when the solid-state light-emitting device 11 has a monolithic structure as shown in, for example, FIG. 10C and FIG. 13C, the number of the light-emitting spots 11B is two or more (here, two) and this applies to the following. On the other hand, when the solid-state light-emitting device 11 includes a plurality of the chips 11A, the number of the light-emitting spots 11B is, for example, equal to the number of the chips 11A as shown in FIG. 8B, FIG. 9B, FIG. 11B, and FIG. 12B. Here, when the solid-state light-emitting device 11 includes the single chip 11A, the size ($P_V \times P_H$) of the light emission region as the solid-state light-emitting device 11 is equal to the size ($P_{V1} \times P_{H1}$) of the light-emitting spot 11B. However, when the solid-state light-emitting device 11 has a monolithic structure, the sizes will be as follows as shown in, for example, FIG. 10C and FIG. 13C and this applies to the following. That is, in the example in FIG. 10C, the size ($P_V \times P_H$) of the light emission region as the solid-state light-emitting device 11 is larger than $P_{V1} \times 2P_{H1}$ and smaller than $W_V \times W_H$. Further, in the example in FIG. 13C, the size ($P_V \times P_H$) of the light emission region as the solid-state light-emitting device 11 is larger than $2P_{V1} \times P_{H1}$ and smaller than $W_V \times W_H$. On the other hand, when the solid-state light-emitting device 11 includes a plurality of the chips 11A, the size ($P_V \times P_H$) of the light emission region as the solid-state light-emitting device 11 is equal to the size of an enclosure when the light-emitting spots 11B of all the chips 11A are enclosed with a minimum area. When a plurality of the chips 11A is arranged in a line in the horizontal direction, the size ($P_V \times P_H$) of the light emission region is larger that $P_{V1} \times 3P_{H1}$ and smaller than $W_V \times W_H$ in the example in FIG. 8B. Similarly, in the example in FIG. 9B, the size ($P_V \times P_H$) of the light emission region is larger than $P_{V1} \times 2P_{H1}$ and smaller than $W_V \times W_H$. When a plurality of the chips 11A is arranged in a line in the vertical direction, the size ($P_V \times P_H$) of the light emission region is larger than $P_{V1} \times 3P_{H1}$ and smaller than $W_V \times W_H$ in the example in FIG. 11B. Similarly, in the example in FIG. 12B, the size ($P_V \times P_H$) of the light emission region is larger than $2P_{V1} \times P_{H1}$ and smaller than $W_V \times W_H$.

The coupling lens 20A, for example, turns light emitted from the light source 10A into substantially parallel light as shown in FIG. 3, and converts a traveling-direction-angle ($\theta_H$, $\theta_V$) of light emitted from the light source 10A to be equal to the traveling-direction-angle of the parallel light or to cause the traveling-direction-angle ($\theta_H$, $\theta_V$) to approach the traveling-direction-angle of the parallel light. The coupling lens 20A is arranged in a position where light within the traveling-direction-angle of light emitted from the light source 10A enters. The coupling lens 20B, for example, turns light emitted from the light source 10B into substantially parallel light as shown in FIGS. 2A and 2B, and converts the traveling-direction-angle ($\theta_H$, $\theta_V$) of light emitted from the light source 10B to be equal to the traveling-direction-angle of the parallel light or to cause the traveling-direction-angle ($\theta_H$, $\theta_V$) to approach the traveling-direction-angle of the parallel light. The coupling lens 20B is arranged in a position where light within the traveling-direction-angle of light emitted from the light source 10B enters. The coupling lens 20C, for example, turns light emitted from the light source 10C into substantially parallel light as shown in FIGS. 2A and 2B, and converts the traveling-direction-angle ($\theta_H$, $\theta_V$) of light emitted from the light source 10C to be equal to the traveling-direction-angle of the parallel light or to cause the traveling-direction-angle ($\theta_H$, $\theta_V$) to approach the traveling-direction-angle of the parallel light. The coupling lens 20C is arranged in a position where light within the traveling-direction-angle of light emitted from the light source 10C enters. The coupling lens 20D, for example, turns light emitted from the light source 10D into substantially parallel light as shown in FIG. 3, and converts the traveling-direction-angle ($\theta_H$, $\theta_V$) of light emitted from the light source 10D to be equal to the traveling-direction-angle of the parallel light or to cause the traveling-direction-angle ($\theta_H$, $\theta_V$) to approach the traveling-direction-angle of the parallel light. The coupling lens 20D is arranged in a position where light within the traveling-direction-angle of light emitted from the light source 10D enters. That is, the coupling lenses 20A, 20B, 20C, and 20D are arranged for the light sources 10A, 10B, 10C, and 10D, respectively, in a one by one fashion. Each of the coupling lenses 20A, 20B, 20C, and 20D may include a single lens or a plurality of lenses.

The dichroic mirrors 30A and 30B include one mirror having wavelength selectivity. The above-mentioned mirror is configured by, for example, evaporating a multilayer interference film. The dichroic mirror 30A is configured to, for example, reflect light incident from the surface of the mirror (light incident from the light source 10B) from the mirror as well as transmitting light incident from the back surface of the mirror (light incident from the light sources 10A and 10D (from the light source unit 10-1)) to the surface of the mirror as shown in FIGS. 2A and 2B. On the other hand, the dichroic mirror 30B is configured to reflect light incident from the surface of the mirror (light incident from the light source 10C) from the mirror as well as transmitting light incident from the back surface of the mirror (light of the light sources 10A, 10B, and 10D incident from the dichroic mirror 30A) to the surface of the mirror as shown in FIGS. 2A and 2B. Consequently, the optical path unifying device 30 is configured to unify each individual light flux emitted from the light sources 10A, 10B, 10C, and 10D into a single light flux.

Figure 14A:
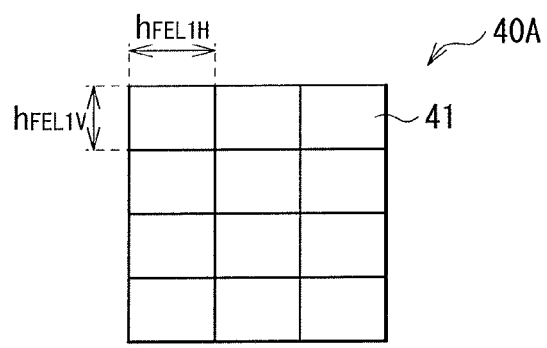
FIGS. 14A and 14B are diagrams each showing an outline configuration of a fly-eye lens in FIGS. 1A and 1B.
Figure 14B:
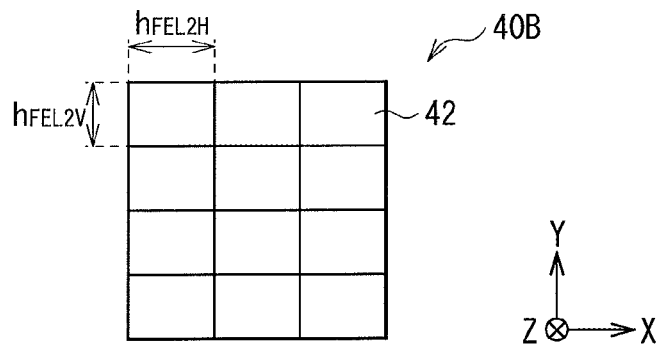

Each of the fly-eye lenses 40A and 40B is configured by a plurality of lenses (cells) arranged in a predetermined array state (here, in the form of a matrix having four rows and three columns) as shown in, for example, FIGS. 14A and 14B. A plurality of cells 42 included in the fly-eye lens 40B is arranged one by one in opposition to each cell 41 of the fly-eye lens 40A. The fly-eye lens 40A is arranged in the focal position (or substantially the focal position) of the fly-eye lens 40B, and the fly-eye lens 40B is arranged in the focal position (or substantially the focal position) of the fly-eye lens 40A. Consequently, the integrator 40 is configured to cause the light flux divided and formed in the fly-eye lens 40A to form a focal point in the vicinity of the lens plane on the image side of the fly-eye lens 40B and to form a secondary light source plane (light source image) thereat. This secondary light source plane is located in a position of a plane conjugate with the entrance pupil of the projection optical system 70. However, it is not necessary for the secondary light source plane to be located strictly in a position of a plane conjugate with the entrance pupil of the projection optical system 70, and it is sufficient to be located within an allowable range of design. The fly-eye lenses 40A and 40B may be formed integrally.

Here, in general, the light flux emitted from the light sources 10A, 10B, 10C, and 10D has an uneven intensity distribution in a plane vertical to their direction of travel. Therefore, if these light fluxes are guided to the illumination region 60A (plane to be irradiated) as they are, the illuminance distribution in the illumination region 60A will become uneven. In contrast to this, if the light flux emitted from the light sources 10A, 10B, 10C, and 10D is split up into a plurality of fluxes by the integrator 40 as described above and then each light flux is guided to the illumination region 60A in an overlapping manner, it is possible to make uniform the illuminance distribution on the illumination region 60A.

The condenser lens 50 is configured to gather light fluxes from a multiple light source formed by the integrator 40 and illuminate the illumination region 60A in an overlapping manner.

The spatial modulation device 60 is configured to two-dimensionally modulate the light flux from the illumination optical system 1A based on a color image signal corresponding to each wavelength component of the light sources 10A, 10B, 10C, and 10D, and thereby generate image light. As shown in, for example, FIGS. 2A and 2B, the spatial modulation device 60 is a transmission type device and includes, for example, a transmission type liquid crystal panel.

[Configuration of Feature of Projector 1]

Next, features of the projector 1 in the present embodiment is described.

[Feature 1]

First, in the present embodiment, the three or more light-emitting spots 11B are provided for the light sources 10A, 10B, 10C, and 10D as a whole to emit light in two or more wavelength bands (in this embodiment, red light, green light, and blue light in three wavelength bands) different from one another. Further, the light-emitting spot 11B configured to emit light in the same wavelength band (in this embodiment, red light, green light, or blue light) between the two or more light sources (in this embodiment, the two light sources 10A and 10D) of these light sources 10A, 10B, 10C, and 10D is (commonly) provided. Further, an optical path unifying section (in this embodiment, the prism 30C) configured to unify light in the same wavelength band described above emitted from these two or more light sources (in this embodiment, the two light sources 10A and 10D), respectively, is provided. In other words, in this embodiment, the three or more of the light-emitting spots are provided within the whole light sources, to allow the whole light sources to emit the light beams in two or more wavelength bands different from one another, and the two or more of the plurality of the light sources include the respective light-emitting spots which emit the light in the same wavelength band. Further, the optical path unifying section configured to unify the light beams in the same wavelength band emitted from the two or more light sources, respectively, is provided.

Specifically, as shown schematically in, for example, FIGS. 15A and 15B, there are arranged a red light-emitting sport 11Br, a green light-emitting spot 11Bg, and a blue light-emitting spot 11Bb in the four light sources 10A, 10B, 10C, and 10D. That is, in the example shown in FIG. 15A, in each of the light sources 10A and 10D, the solid-state light-emitting device 11 has the one green light-emitting spot 11Bg. In the light source 10B, the solid-state light-emitting device 11 has the one blue light-emitting spot 11Bb. In the light source 10C, the solid-state light-emitting device 11 has the one red light-emitting spot 11Br. In the example shown in FIG. 15B, in each of the light sources 10A and 10D, the solid-state light-emitting device 11 has the two green light-emitting spots 11Bg. In the light source 10B, the solid-state light-emitting device 11 has the one blue light-emitting spot 11Bb. In the light source 10C, the solid-state light-emitting device 11 has the one red light-emitting spot 11Br. Further, in each of these examples shown in FIGS. 15A and 15B, an optical path unifying section (in this embodiment, the prism 30C) configured to unify light in the same waveband (in this embodiment, green light) described above emitted from each of the two or more light sources (in this embodiment, the two light sources 10A and 10D) described above is provided within the light source unit 10-1.

[Feature 2]

Also, in the present embodiment, it is desirable for the configuration to be as follows when a plurality of the light-emitting spots 11B in the chip 11A including LD is provided in at least one of the light sources 10A, 10B, 10C, and 10D. That is, first, it is desirable for each of the directions of the minor axis of a far field pattern (FFP) in light emitted from each light-emitting spot 11B to substantially agree with (preferably, agree with) the direction of the minor axis (here, the y-axis direction) in the plane (here, the xy plane) perpendicular to the optical axis (here, the z-axis direction) of the optical member (here, the integrator 40) described earlier (i.e., the direction of the minor axis of the FFP in light emitted from each of the light-emitting spots substantially agrees with the direction of the minor axis of the optical member in a plane perpendicular to the optical axis of the optical member). In other words, it is desirable for the directions of the minor axis of FFP of light emitted from each light-emitting spot 11B to substantially agree with (preferably, agree with) the direction of the minor axis in the unit outer shape of the projector 1 (for example, a rectangular housing). When the above-mentioned light sources are those configured to emit light in two or more wavelength bands different from one another, it is desirable for the directions of the major axis of FFP of light emitted from each light-emitting spot 11B to substantially agree with (preferably, agree with) each other between these two or more wavelength bands.

Specifically, in the example shown in FIG. 16A, in the light source described above, two chips 11A-1 and 11A-2 including LD are provided, and light-emitting spots (near field pattern: NFP) 11B-1 and 11B-2 including an active layer 110 are provided. On the other hand, in the example shown in FIG. 16B (example of the monolithic structure described earlier), in the light source described above, the one chip 11A including LD is provided, and the two light-emitting spots 11B-1 and 11B-2 are provided within the chip 11A. Further, it is assumed here that light in the same wavelength band or light in two wavelength bands different from each other is emitted from the light-emitting spots 11B-1 and 11B-2. In this case, the directions of the minor axis (here, the y-axis direction) of FFP (see reference symbols P11 and P12 in the drawing) in light emitted from each of the light-emitting spots 11B-1 and 11B-2 agree respectively with the directions of the minor axis (here, the y-axis direction) in the plane perpendicular to the optical axis of the integrator 40. Also, the directions of the major axis (here, the x-axis direction) of FFP in light emitted from each of the light-emitting spots 11B-1 and 11B-2 agree with each other between these light-emitting spots 11B-1 and 11B-2.

[Feature 3]

Figure 17:
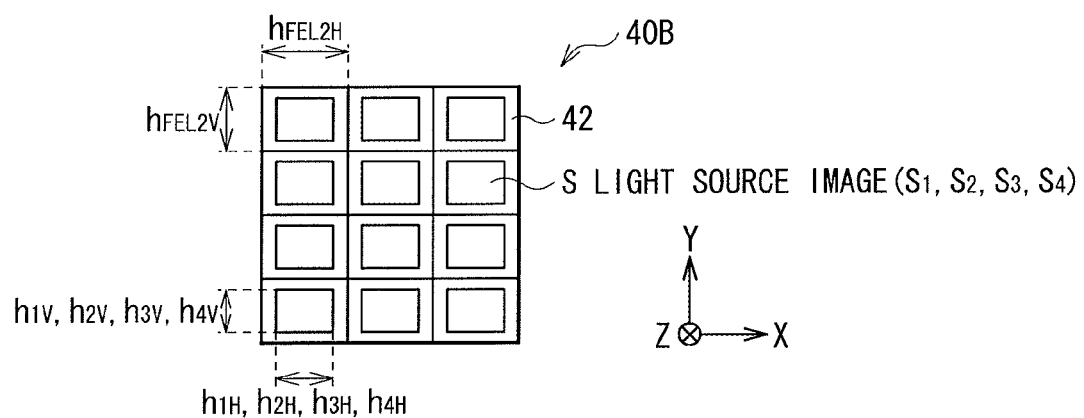
FIG. 17 is a schematic diagram showing an example of a light source image that appears on a fly-eye lens in a post stage in the projector in FIGS. 1A and 1B.

Further, in the present embodiment, it is preferable for the focal distances of the coupling lenses 20A, 20B, 20C, and 20D and the focal distances of the fly-eye lenses 40A and 40B to be set so as to prevent the size of each light source image S formed on the fly-eye lens 40B by each cell 41 of the fly-eye lens 40A by exceeding the size of the one cell 42 of the fly-eye lens 40B. This is represented by the following expressions (1) to (4). Further, this is schematically represented as in FIG. 17. FIG. 17 illustrates a case where each cell of the fly-eye lenses 40A and 40B has an aspect ratio other than 1. FIG. 17 will be described later in detail.

$$h_1 = P_1 \times (f_{FEL}/f_{CL1}) \le h_{FEL2} \quad (1)$$

$$h_2 = P_2 \times (f_{FEL}/f_{CL2}) \le h_{FEL2} \quad (2)$$

$$h_3 = P_3 \times (f_{FEL}/f_{CL3}) \le h_{FEL2} \quad (3)$$

$$h_4 = P_4 \times (f_{FEL}/f_{CL4}) \le h_{FEL2} \quad (4)$$

where $h_1$: size of the light source image S (light source image $S_1$) formed by light of the light source 10A;

$h_2$: size of the light source image S (light source image $S_2$) formed by light of the light source 10B;

$h_3$: size of the light source image S (light source image $S_3$) formed by light of the light source 10C;

$h_4$: size of the light source image S (light source image $S_4$) formed by light of the light source 10D;

$P_1$: size of the light emission region of the solid-state light-emitting device 11 included in the light source 10A;

$P_2$: size of the light emission region of the solid-state light-emitting device 11 included in the light source 10B;

$P_3$: size of the light emission region of the solid-state light-emitting device 11 included in the light source 10C;

$P_4$: size of the light emission region of the solid-state light-emitting device 11 included in the light source 10D;

$f_{FEL}$: focal distance of the fly-eye lenses 40A and 40B;

$f_{CL1}$: focal distance of the coupling lens 20A;

$f_{CL2}$: focal distance of the coupling lens 20B;

$f_{CL3}$: focal distance of the coupling lens 20C;

$f_{CL4}$: focal distance of the coupling lens 20D; and $h_{FEL2}$: size of one cell 42 of the fly-eye lens 40B.

When the solid-state light-emitting device 11 included in the light source 10A includes the single chip 11A, $P_1$ is equal to the size of the light-emitting spot 11B of that chip 11A. Similarly, when the solid-state light-emitting device 11 included in the light source 10B includes the single chip 11A, $P_2$ is equal to the size of the light-emitting spot 11B of that chip 11A. When the solid-state light-emitting device 11 included in the light source 10C includes the single chip 11A, $P_3$ is equal to the size of the light-emitting spot 11B of that chip 11A. When the solid-state light-emitting device 11 included in the light source 10D includes the single chip 11A, $P_4$ is equal to the size of the light-emitting spot 11B of that chip 11A. When the solid-state light-emitting device 11 included in the light source 10A includes a plurality of the chips 11A, $P_1$ is equal to the size of an enclosure when the light-emitting spots 11B of all the chips 11A are enclosed with a minimum area. Similarly, when the solid-state light-emitting device 11 included in the light source 10B includes a plurality of the chips 11A, $P_2$ is equal to the size of an enclosure when the light-emitting spots 11B of all the chips 11A are enclosed with a minimum area. When the solid-state light-emitting device 11 included in the light source 10C includes a plurality of the chips 11A, $P_3$ is equal to the size of an enclosure when the light-emitting spots 11B of all the chips 11A are enclosed with a minimum area. When the solid-state light-emitting device 11 included in the light source 10D includes a plurality of the chips 11A, $P_4$ is equal to the size of an enclosure when the light-emitting spots 11B of all the chips 11A are enclosed with a minimum area. Further, when the coupling lens 20A includes a plurality of lenses, $f_{CL1}$ is taken as the unified focal distance of each lens. Similarly, when the coupling lens 20B includes a plurality of lenses, $f_{CL2}$ is taken as the unified focal distance of each lens. When the coupling lens 20C includes a plurality of lenses, $f_{CL3}$ is taken as the unified focal distance of each lens. When the coupling lens 20D includes a plurality of lenses, $f_{CL4}$ is taken as the unified focal distance of each lens.

Here, as expressions substantially equivalent to the expressions (1) to (4) described above, mention is made of the following expressions (5) to (8). The expressions (5) to (8) are particularly useful when the size of the light emission region of the solid-state light-emitting device 11 is substantially the same as the size of the solid-state light-emitting device 11.

$$h_1 = W_1 \times (f_{FEL}/f_{CL1}) \le h_{FEL2} \quad (5)$$

$$h_2 = W_2 \times (f_{FEL}/f_{CL2}) \le h_{FEL2} \quad (6)$$

$$h_3 = W_3 \times (f_{FEL}/f_{CL3}) \le h_{FEL2} \quad (7)$$

$$h_4 = W_4 \times (f_{FEL}/f_{CL1}) \le h_{FEL2} \quad (8)$$

where $W_1$: size of the solid-state light-emitting device 11 included in the light source 10A;

$W_2$: size of the solid-state light-emitting device 11 included in the light source 10B;

$W_3$: size of the solid-state light-emitting device 11 included in the light source 10C; and $W_4$: size of the solid-state light-emitting device 11 included in the light source 10D.

When the solid-state light-emitting device 11 includes the single chip 11A, W is equal to the size of that chip 11A. When the solid-state light-emitting device 11 includes a plurality of the chips 11A, W is equal to the size of a chip when all the chips 11A are regarded as the single chip.

In the present embodiment, for example, as shown in FIGS. 14A and 14B, when each of the cells 41 and 42 of the fly-eye lenses 40A and 40B has an aspect ratio other than 1, it is preferable for the focal distances of the coupling lenses 20A, 20B, 20C, and 20D and the focal distances of the fly-eye lenses 40A and 40B to satisfy the following eight relational expressions. Further, more preferably, the ratio (or anamorphic ratio) of the horizontal and vertical focal distances ($f_{CL1H}/f_{CL1V}$, $f_{CL2H}/f_{CL2V}$, $f_{CL3H}/f_{CL3V}$, $f_{CL4H}/f_{CL4V}$) of the coupling lenses 20A, 20B, 20C, and 20D is set equal to the inverse ($h_{FEL2V}/h_{FEL2H}$) of the aspect ratio of the size of each cell 42 of the fly-eye lens 40B, and the illumination optical system 1A is formed into an anamorphic optical system. For example, when each cell 42 of the fly-eye lens 40B has a shape elongated in a first direction (for example, horizontal direction), as the coupling lenses 20A, 20B, 20C, and 20D, those of which the focal distances $f_{CL1V}$, $f_{CL2V}$, $f_{CL3V}$, and $f_{CL4V}$ are longer than the focal distances $f_{CL1H}$, $f_{CL2H}$, $f_{CL3H}$, and $f_{CL4H}$ are used. When the following expressions (9) to (16) are expressed schematically, those in FIG. 17 are obtained.

$$h_{1H} = P_{1H} \times (f_{FELH}/f_{CL1H}) \le h_{FEL2H} \quad (9)$$

$$h_{2H} = P_{2H} \times (f_{FELH}/f_{CL2H}) \le h_{FEL2H} \quad (10)$$

$$h_{3H} = P_{3H} \times (f_{FELH}/f_{CL3H}) \le h_{FEL2H} \quad (11)$$

$$h_{4H} = P_{4H} \times (f_{FELH}/f_{CL4H}) \le h_{FEL2H} \quad (12)$$

$$h_{1V} = P_{1V} \times (f_{FELV}/f_{CL1V}) \le h_{FEL2V} \quad (13)$$

$$h_{2V}=P_{2V}\times(f_{FELV}/f_{CL2V})\leq h_{FEL2V} \quad (14)$$

$$h_{3V}=P_{3V}\times(f_{FELV}/f_{CL3V})\leq h_{FEL2V} \quad (15)$$

$$h_{4V}=P_{4V}\times(f_{FELV}/f_{CL4V})\leq h_{FEL2V} \quad (16)$$

where $h_{1H}$: size in the first direction (for example, horizontal direction) of the light source image S (light source image $S_1$) formed by light of the light source 10A;

$h_{2H}$: size in the first direction (for example, horizontal direction) of the light source image S (light source image $S_2$) formed by light of the light source 10B;

$h_{3H}$: size in the first direction (for example, horizontal direction) of the light source image S (light source image $S_3$) formed by light of the light source 10C;

$h_{4H}$: size in the first direction (for example, horizontal direction) of the light source image S (light source image $S_4$) formed by light of the light source 10D;

$h_{1V}$: size in a second direction (for example, vertical direction) perpendicular to the first direction of the light source image S (light source image $S_1$) formed by light of the light source 10A;

$h_{2V}$: size in the second direction (for example, vertical direction) perpendicular to the first direction of the light source image S (light source image $S_2$) formed by light of the light source 10B;

$h_{3V}$: size in the second direction (for example, vertical direction) perpendicular to the first direction of the light source image S (light source image $S_3$) formed by light of the light source 10C;

$h_{4V}$: size in the second direction (for example, vertical direction) perpendicular to the first direction of the light source image S (light source image $S_4$) formed by light of the light source 10D;

$P_{1H}$: size in the first direction or a direction corresponding to the first direction of the light emission region of the solid-state light-emitting device 11 included in the light source 10A;

$P_{2H}$: size in the first direction or a direction corresponding to the first direction of the light emission region of the solid-state light-emitting device 11 included in the light source 10B;

$P_{3H}$: size in the first direction or a direction corresponding to the first direction of the light emission region of the solid-state light-emitting device 11 included in the light source 10C;

$P_{4H}$: size in the first direction or a direction corresponding to the first direction of the light emission region of the solid-state light-emitting device 11 included in the light source 10D;

$P_{1V}$: size in the second direction or a direction corresponding to the second direction of the light emission region of the solid-state light-emitting device 11 included in the light source 10A;

$P_{2V}$: size in the second direction or a direction corresponding to the second direction of the light emission region of the solid-state light-emitting device 11 included in the light source 10B;

$P_{3V}$: size in the second direction or a direction corresponding to the second direction of the light emission region of the solid-state light-emitting device 11 included in the light source 10C;

$P_{4V}$: size in the second direction or a direction corresponding to the second direction of the light emission region of the solid-state light-emitting device 11 included in the light source 10D;

$f_{FELH}$: focal distance in the first direction of the fly-eye lenses 40A and 40B;

$f_{FELV}$: focal distance in the second direction of the fly-eye lenses 40A and 40B;

$f_{CL1H}$: focal distance in the first direction or a direction corresponding to the first direction of the coupling lens 20A;

$f_{CL2H}$: focal distance in the first direction or a direction corresponding to the first direction of the coupling lens 20B;

$f_{CL3H}$: focal distance in the first direction or a direction corresponding to the first direction of the coupling lens 20C;

$f_{CL4H}$: focal distance in the first direction or a direction corresponding to the first direction of the coupling lens 20D;

$f_{CL1V}$: focal distance in the second direction or a direction corresponding to the second direction of the coupling lens 20A;

$f_{CL2V}$: focal distance in the second direction or a direction corresponding to the second direction of the coupling lens 20B;

$f_{CL3V}$: focal distance in the second direction or a direction corresponding to the second direction of the coupling lens 20C;

$f_{CL4V}$: focal distance in the second direction or a direction corresponding to the second direction of the coupling lens 20D;

$h_{FEL2H}$: size in the first direction of one cell 42 of the fly-eye lens 40B; and $h_{FEL2V}$: size in the second direction of one cell 42 of the fly-eye lens 40B.

Here, the "first direction or a direction corresponding to the first direction" refers to the first direction when the light sources 10A, 10B, 10C, and 10D and the coupling lenses 20A, 20B, 20C, and 20D are arranged on the optical axis of the integrator 40. The "first direction or a direction corresponding to the first direction" refers to a direction corresponding to the first direction in relation to the layout of optical devices arranged on an optical path from the light sources 10A, 10B, 10C, and 10D up to the integrator 40 when the light sources 10A, 10B, 10C, and 10D and the coupling lenses 20A, 20B, 20C, and 20D are arranged on an optical path deviated from the optical axis of the integrator 40.

Further, the "second direction or a direction corresponding to the second direction" refers to the second direction when the light sources 10A, 10B, 10C, and 10D and the coupling lenses 20A, 20B, 20C, and 20D are arranged on the optical axis of the integrator 40. The "second direction or a direction corresponding to the second direction" refers to a direction corresponding to the second direction in relation to the layout of optical devices arranged on an optical path from the light sources 10A, 10B, 10C, and 10D up to the integrator 40 when the light sources 10A, 10B, 10C, and 10D and the coupling lenses 20A, 20B, 20C, and 20D are arranged on an optical path deviated from the optical axis of the integrator 40.

When the solid-state light-emitting device 11 included in the light source 10A includes the single chip 11A, $P_{1H}$ is equal to the size of the light-emitting spot 11B of that chip 11A in the first direction or a direction corresponding to the first direction. Similarly, when the solid-state light-emitting device 11 included in the light source 10B includes the single chip 11A, $P_{2H}$ is equal to the size of the light-emitting spot 11B of that chip 11A in the first direction or a direction corresponding to the first direction. When the solid-state light-emitting device 11 included in the light source 10C includes the single chip 11A, $P_{3H}$ is equal to the size of the light-emitting spot 11B of that chip 11A in the first direction or a direction corresponding to the first direction. When the solid-state light-emitting device 11 included in the light source 10D includes the single chip 11A, $P_{4H}$ is equal to the size of the light-emitting spot 11B of that chip 11A in the first direction or a direction corresponding to the first direction. Further, when the solid-state light-emitting device 11 included in the light source 10A includes a plurality of the chips 11A, $P_{1H}$ is equal to the size of an enclosure in the first direction or a direction corresponding to the first direction when the light-emitting spots 11B of all the chips 11A are enclosed with a minimum area. Similarly, when the solid-state light-emitting device 11 included in the light source 10B includes a plurality of the chips 11A, $P_{2H}$ is equal to the size of an enclosure in the first direction or a direction corresponding to the first direction when the light-emitting spots 11B of all the chips 11A are enclosed with a minimum area. When the solid-state light-emitting device 11 included in the light source 10C includes a plurality of the chips 11A, $P_{3H}$ is equal to the size of an enclosure in the first direction or a direction corresponding to the first direction when the light-emitting spots 11B of all the chips 11A are enclosed with a minimum area. When the solid-state light-emitting device 11 included in the light source 10D includes a plurality of the chips 11A, $P_{4H}$ is equal to the size of an enclosure in the first direction or a direction corresponding to the first direction when the light-emitting spots 11B of all the chips 11A are enclosed with a minimum area. On the other hand, when the solid-state light-emitting device 11 included in the light source 10A includes the single chip 11A, $P_{1V}$ is equal to the size of the light-emitting spot 11B of that chip 11A in the second direction or a direction corresponding to the second direction. Similarly, when the solid-state light-emitting device 11 included in the light source 10B includes the single chip 11A, $P_{2V}$ is equal to the size of the light-emitting spot 11B of that chip 11A in the second direction or a direction corresponding to the second direction. When the solid-state light-emitting device 11 included in the light source 10C includes the single chip 11A, $P_{3V}$ is equal to the size of the light-emitting spot 11B of that chip 11A in the second direction or a direction corresponding to the second direction. When the solid-state light-emitting device 11 included in the light source 10D includes the single chip 11A, $P_{4V}$ is equal to the size of the light-emitting spot 11B of that chip 11A in the second direction or a direction corresponding to the second direction. Further, when the solid-state light-emitting device 11 included in the light source 10A includes a plurality of the chips 11A, $P_{1V}$ is equal to the size of an enclosure in the second direction or a direction corresponding to the second direction when the light-emitting spots 11B of all the chips 11A are enclosed with a minimum area. Similarly, when the solid-state light-emitting device 11 included in the light source 10B includes a plurality of the chips 11A, $P_{2V}$ is equal to the size of an enclosure in the second direction or a direction corresponding to the second direction when the light-emitting spots 11B of all the chips 11A are enclosed with a minimum area. When the solid-state light-emitting device 11 included in the light source 10C includes a plurality of the chips 11A, $P_{3V}$ is equal to the size of an enclosure in the second direction or a direction corresponding to the second direction when the light-emitting spots 11B of all the chips 11A are enclosed with a minimum area. When the solid-state light-emitting device 11 included in the light source 10D includes a plurality of the chips 11A, $P_{4V}$ is equal to the size of an enclosure in the second direction or a direction corresponding to the second direction when the light-emitting spots 11B of all the chips 11A are enclosed with a minimum area.

Figure 18:
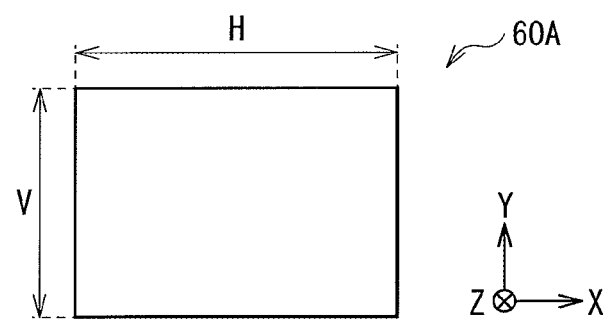
FIG. 18 is a schematic diagram for explaining the size of the illumination region in FIGS. 1A and 1B.

In the present embodiment, when each of the cells 41 and 42 of the fly-eye lenses 40A and 40B has an aspect ratio other than 1, it is preferable for the aspect ratio of the size of each cell 41A of the fly-eye lens 40A and the aspect ratio of the illumination region 60A to satisfy the following relational expression (expression (17)). Here, an aspect ration H/V of the illumination region 60A (see FIG. 18) has a correlation with the resolution of the spatial modulation device 60. For example, when the resolution of the spatial modulation device 60 is VGA (640×480), the aspect ratio is 640/480, and when the resolution of the spatial modulation device 60 is WVGA (800×480), the aspect ratio is 800/480.

$$h_{FEL1H}/h_{FEL1V}=H/V \quad (18)$$

where $h_{FEL1H}$: size in the first direction of one cell of the fly-eye lens 40A;

$h_{FEL1V}$: size in the second direction of one cell of the fly-eye lens 40A;

H: size in the first direction of the illumination region 60A; and

V: size in the second direction of the illumination region 60A.

[Feature 4]

In addition, in the present embodiment, it is preferable for the focal distances and the numerical apertures of the coupling lenses 20A, 20B, 20C, and 20D to be set so as to prevent the beam size of light incident on the coupling lenses 20A, 20B, 20C, and 20D from exceeding the size of the coupling lenses 20A, 20B, 20C, and 20D. This is represented by the following expressions (19) to (22).

$$\phi_{CL1}=2\times f_{CL1}\times NA_1 \leq h_{CL1} \quad (19)$$

$$\phi_{CL2}=2\times f_{CL2}\times NA_2 \leq h_{CL2} \quad (20)$$

$$\phi_{CL3}=2\times f_{CL3}\times NA_3 \leq h_{CL3} \quad (21)$$

$$\phi_{CL4}=2\times f_{CL4}\times NA_4 \leq h_{CL4} \quad (22)$$

where $\phi_{CL1}$: beam size of light incident on the coupling lens 20A;
$\phi_{CL2}$: beam size of light incident on the coupling lens 20B;
$\phi_{CL3}$: beam size of light incident on the coupling lens 20C;
$\phi_{CL4}$: beam size of light incident on the coupling lens 20D;
$NA_1$: numerical aperture of the coupling lens 20A;
$NA_2$: numerical aperture of the coupling lens 20B;
$NA_3$: numerical aperture of the coupling lens 20C;
$NA_4$: numerical aperture of the coupling lens 20D;
$h_{CL1}$: size of the coupling lens 20A;
$h_{CL2}$: size of the coupling lens 20B;
$h_{CL3}$: size of the coupling lens 20C; and
$h_{CL4}$: size of the coupling lens 20D In the present embodiment, when the coupling lenses 20A, 20B, 20C, and 20D have an aspect ratio other than 1, it is preferable for the focal distances and the numerical apertures of the coupling lenses 20A, 20B, 20C, and 20D to satisfy the following relational expressions (expression (23) to (30)).

$$\phi_{CL1H}=2\times f_{CL1H}\times NA_{1H} \leq h_{CL1H} \quad (23)$$

$$\phi_{CL2H}=2\times f_{CL2H}\times NA_{2H} \leq h_{CL2H} \quad (24)$$

$$\phi_{CL3H}=2\times f_{CL3H}\times NA_{3H} \leq h_{CL3H} \quad (25)$$

$$\phi_{CL4H}=2\times f_{CL4H}\times NA_{4H} \leq h_{CL4H} \quad (26)$$

$$\phi_{CL1V}=2\times f_{CL1V}\times NA_{1V} \leq h_{CL1V} \quad (27)$$

$$\phi_{CL2V}=2\times f_{CL2V}\times NA_{2V} \leq h_{CL2V} \quad (28)$$

$$\phi_{CL3V}=2\times f_{CL3V}\times NA_{3V} \leq h_{CL3V} \quad (29)$$

$$\phi_{CL4V}=2\times f_{CL4V}\times NA_{4V} \leq h_{CL4V} \quad (30)$$

where $\phi_{CL1H}$: beam size in the first direction (for example, horizontal direction) or a direction corresponding to the first direction of light incident on the coupling lens 20A;

$\phi_{CL2H}$: beam size in the first direction (for example, horizontal direction) or a direction corresponding to the first direction of light incident on the coupling lens 20B;

$\phi_{CL3H}$: beam size in the first direction (for example, horizontal direction) or a direction corresponding to the first direction of light incident on the coupling lens 20C;

$\phi_{CL4H}$: beam size in the first direction (for example, horizontal direction) or a direction corresponding to the first direction of light incident on the coupling lens 20D;

$\phi_{CL1V}$: beam size in the second direction (for example, vertical direction) or a direction corresponding to the second direction of light incident on the coupling lens 20A;

$\phi_{CL2V}$: beam size in the second direction (for example, vertical direction) or a direction corresponding to the second direction of light incident on the coupling lens 20B;

$\phi_{CL3V}$: beam size in the second direction (for example, vertical direction) or a direction corresponding to the second direction of light incident on the coupling lens 20C;

$\phi_{CL4V}$: beam size in the second direction (for example, vertical direction) or a direction corresponding to the second direction of light incident on the coupling lens 20D;

$NA_{1H}$: numerical aperture of the coupling lens 20A in the first direction or a direction corresponding to the first direction;

$NA_{2H}$: numerical aperture of the coupling lens 20B in the first direction or a direction corresponding to the first direction;

$NA_{3H}$: numerical aperture of the coupling lens 20C in the first direction or a direction corresponding to the first direction;

$NA_{4H}$: numerical aperture of the coupling lens 20D in the first direction or a direction corresponding to the first direction;

$NA_{1V}$: numerical aperture of the coupling lens 20A in the second direction or a direction corresponding to the second direction of the coupling lens 20A;

$NA_{2V}$: numerical aperture of the coupling lens 20B in the second direction or a direction corresponding to the second direction;

$NA_{3V}$: numerical aperture of the coupling lens 20C in the second direction or a direction corresponding to the second direction;

$NA_{4V}$: numerical aperture of the coupling lens 20D in the second direction or a direction corresponding to the second direction;

$h_{CL1H}$: size of the coupling lens 20A in the first direction or a direction corresponding to the first direction;

$h_{CL2H}$: size of the coupling lens 20B in the first direction or a direction corresponding to the first direction;

$h_{CL3H}$: size of the coupling lens 20C in the first direction or a direction corresponding to the first direction;

$h_{CL4H}$: size of the coupling lens 20D in the first direction or a direction corresponding to the first direction;

$h_{CL1V}$: size of the coupling lens 20A in the second direction or a direction corresponding to the second direction;

$h_{CL2V}$: size of the coupling lens 20B in the second direction or a direction corresponding to the second direction;

$h_{CL3V}$: size of the coupling lens 20C in the second direction or a direction corresponding to the second direction; and $h_{CL4V}$: size of the coupling lens 20D in the second direction or a direction corresponding to the second direction.

[Working and Effect of Projector 1]

Next, the working and effect of the projector 1 in the present embodiment are described.

First, in the present embodiment, as shown in, for example, in FIGS. 15A and 15B, the three or more light-emitting spots 11B are provided for the light sources 10A, 10B, 10C, and 10D as a whole, to emit light in two or more wavelength bands different from one another (here, red light, green light, and blue light in three wavelength bands). Also, the light-emitting spot 11B configured to emit light (here, red light, green light, or blue light) in the same wavelength band between two or more light sources (here, the two light sources 10A and 10D) of these light sources 10A, 10B, 10C, and 10D is provided. In other words, the three or more of the light-emitting spots are provided within the whole light sources, to allow the whole light sources to emit the light beams in two or more wavelength bands different from one another, and the two or more of the plurality of the light sources include the respective light-emitting spots which emit the light in the same wavelength band.

Here, in a projector, a color display is produced generally using light of the three primary colors, that is, red light, green light, and blue light. However, in a device configured to emit light of each primary color (chip within a solid-state light-emitting device), there is a case where the light emission intensity (luminance) differs from color to color and in such a case, it has been difficult to make an attempt to improve luminance of illumination light as a whole from a currently-available illumination unit (illumination optical system). This is because, for example, when the light emission intensity of one color (for example, green light) of the three primary colors is relatively lower compared to the light emission intensity of the other two colors (for example, red light and blue light), it is necessary to make an adjustment based on the relatively lower light emission intensity if an attempt is made to adjust white balance of the illumination light as a whole.

In contrast to this, in the present embodiment, the light sources 10A, 10B, 10C, and 10D have the configuration described above. Therefore, when the light beams in two or more wavelength bands (here, red light, green light, and blue light) is emitted from the illumination optical system 1A as the illumination light, it is made possible to adjust the relative light emission intensities between the light of the respective wavelength bands. Consequently, when white balance of illumination light as a whole is adjusted as in the past, it is possible to avoid making an adjustment based on a relatively lower light emission intensity, and therefore, it is made possible to improve luminance of illumination light.

Also, in the present embodiment, for example as shown in FIGS. 16A and 16B, when the plurality of the light-emitting spots 11B in the chip 11A including LD is provided in at least one light source of the light sources 10A, 10B, 10C, and 10D, the following working and effect are obtained when the configuration is as follows. That is, first, when the directions of the minor axis of FFP in light emitted from each of the light-emitting spots 11B are respectively caused to substantially agree with the direction of the minor axis in the plane perpendicular to the optical axis of the integrator 40, the direction of the minor axis and the direction of the minor axis of the FFP in the unit outer shape of the projector 1 substantially agree with each other, and therefore, it is made possible to make an attempt to further downsize the whole of the projector 1. Further, when the light sources described above are those configured to emit light in two or more wavelength bands different from one another, if the directions of the major axis of FFP of light emitted from each of the light-emitting spots 11B are caused to substantially agree with one another between these two or more wavelength bands, the loss of light is reduced when, for example, a lens cut into the shape of I is used. Specifically, when a lens cut into the shape of I is used, an optically effective range is sacrificed in the part cut into the shape of I, however, it is possible to reduce the loss of light by causing the direction of the major axis of the emission angle of LD to agree with the direction in which the part is cut into the shape of I (direction in which the effective diameter is great).

Further, in the present embodiment, for example, as shown in FIG. 17, when the focal distances $f_{CL1}$, $f_{CL2}$, $f_{CL3}$, and $f_{CL4}$ of the coupling lenses 20A, 20B, 20C, and 20D and the focal distance $f_{FEL}$ of the fly-eye lenses 40A and 40B are set so as to prevent the size of each light source image S formed on the fly-eye lens 40B by each cell 41 of the fly-eye lens 40A from exceeding the size of one cell 42 of the fly-eye lens 40B, the following working and effect are brought about. Here, the solid-state light-emitting device 11 is configured to emit light from the light emission region including a single or a plurality of light-emitting spots in the shape of a point or not in the shape of a point, and includes, for example, one or more light-emitting diodes, one or more organic EL light-emitting devices, or one or more laser diodes. Because of that, even if the fly-eye lens 40B is arranged in the focal position of the fly-eye lens 40A, each of the light source images S formed on the fly-eye lens 40B by each cell of the fly-eye lens 40A is not in the shape of a point but has a size to a certain degree (see FIG. 17). However, in the present embodiment, one light source image S is not formed across a plurality of cells, and therefore, light incident on the fly-eye lens 40B reaches the illumination region efficiently. Consequently, it is possible to improve light use efficiency in the illumination optical system 1A.

In addition, in the present embodiment, when each cell of the fly-eye lenses 40A and 40B has an aspect ratio other than 1, if the focal distances $f_{CL1H}$, $f_{CL2H}$, $f_{CL3H}$, $f_{CL4H}$, $f_{CL1V}$, $f_{CL2V}$, $f_{CL3V}$, and $f_{CL4V}$ of the coupling lenses 20A, 20B, 20C, and 20D and the focal distances $f_{FELH}$ and $f_{FELV}$ of the fly-eye lenses 40A and 40B are set in view of the aspect ratio, it is possible to further improve light use efficiency in the illumination optical system 1A. Further, in the present embodiment, when the coupling lenses 20A, 20B, 20C, and 20D have an aspect ratio other than 1, if the focal distances $f_{CL1H}$, $f_{CL2H}$, $f_{CL3H}$, $f_{CL4H}$, $f_{CL1V}$, $f_{CL2V}$, $f_{CL3V}$, and $f_{CL4V}$ and the numerical apertures $NA_{1H}$, $NA_{2H}$, $NA_{3H}$, $NA_{4H}$, $NA_{1V}$, $NA_{2V}$, $NA_{3V}$, and $NA_{4V}$ of the coupling lenses 20A, 20B, 20C, and 20D are set in view of that aspect ratio, it is possible to further improve light use efficiency in the illumination optical system 1A. Furthermore, in the present embodiment, when the traveling-direction-angles of the light sources 10A, 10B, 10C, and 10D are different from one another, if the focal distances $f_{CL1H}$, $f_{CL2H}$, $f_{CL3H}$, $f_{CL4H}$, $f_{CL1V}$, $f_{CL2V}$, $f_{CL3V}$, and $f_{CL4V}$ and the numerical apertures $NA_{1H}$, $NA_{2H}$, $NA_{3H}$, $NA_{4H}$, $NA_{1V}$, $NA_{2V}$, $NA_{3V}$, and $NA_{4V}$ of the coupling lenses 20A, 20B, 20C, and 20D are set in view of the respective traveling-direction-angles, it is possible to further improve light use efficiency in the illumination optical system 1A.

Subsequently, other embodiments (second and third embodiments) of the present disclosure are explained. The same reference symbols are attached to the same components as those in the first embodiment described above and their explanation will be omitted appropriately.

Second Embodiment

Figure 19A:
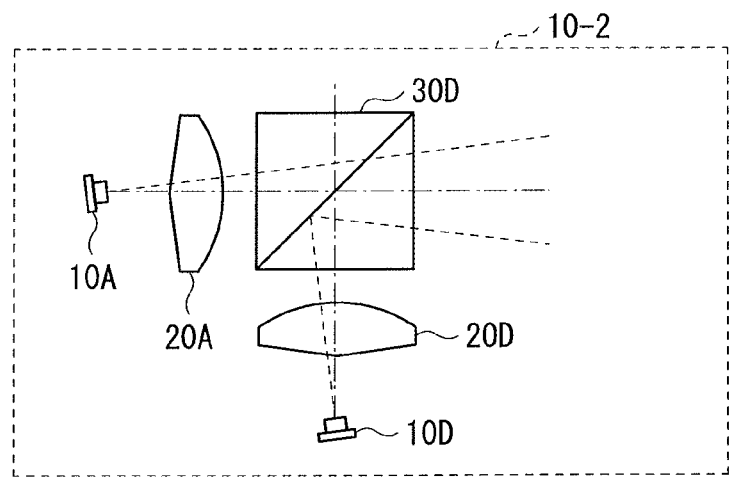
FIGS. 19A to 19C are diagrams representing a configuration example of a light source unit and a phase-difference plate array according to a second embodiment.
Figure 19B:
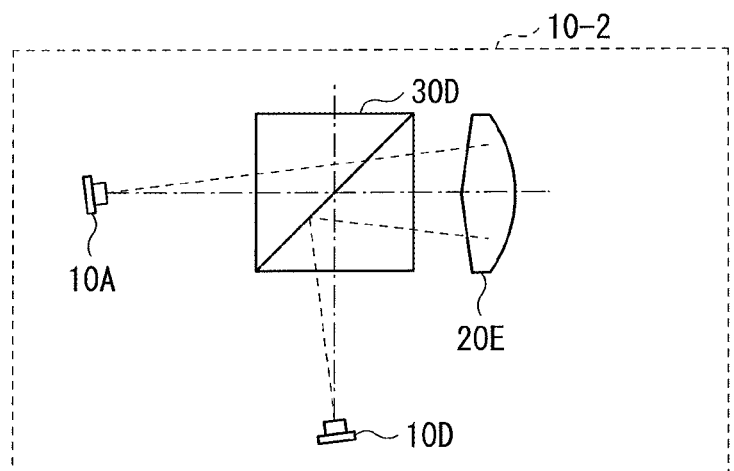
Figure 19C:
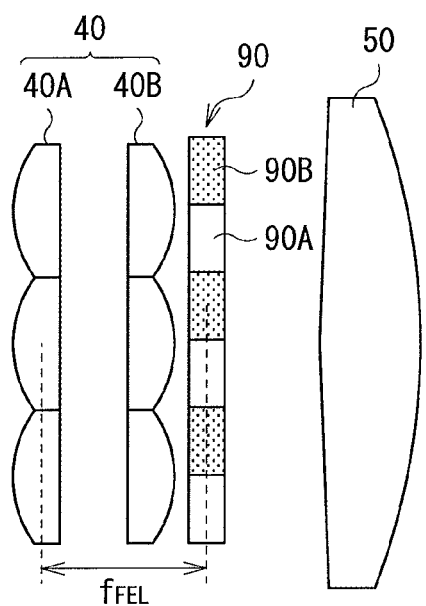

FIGS. 19A to 19C represent a configuration example of a light source unit (light source unit 10-2) and a phase-difference plate array 90 applied to a projector according to a second embodiment. Specifically, FIGS. 19A and 19B show a detailed configuration example of the light source unit 10-2 in the present embodiment and FIG. 19C shows a configuration example of the phase-difference plate array 90 in the present embodiment. The projector in the present embodiment is provided with the light source unit 10-2 in place of the light source unit 10-1, and the phase-difference plate array 90 is further provided in the illumination optical system 1, in the first embodiment described above.

As shown in FIG. 19A for example, the light source unit 10-2 has the light sources 10A and 10D, the coupling lenses 20A and 20D, and a polarization beam splitter 30D. Alternatively, as shown in FIG. 19B for example, the light source unit 10-2 has the light sources 10A and 10D, the polarization beam splitter 30D, and a coupling lens 20E. The coupling lens 20E is configured to turn light emitted from the light sources 10A and 10D and entering via the polarization beam splitter 30D into substantially parallel light, and also configured to convert a traveling-direction-angle ($\theta_H$, $\theta_V$) of light emitted from the light sources 10A and 10D to be equal to the traveling-direction-angle of the parallel light, or to approach that angle. The phase-difference plate array 90 is provided, as shown in FIG. 19C for example, between the integrator 40 and the condenser lens 50 (or the illumination region 60A described earlier). In the present embodiment, the fly-eye lens 40B is arranged before the focal position of the fly-eye lens 40A, and the phase-difference plate array 90 is arranged in the focal position (or substantially the focal position) of the fly-eye lens 40A. The coupling lenses 20A and 20D or the coupling lens 20E, the polarization beam splitter 30D, the integrator 40, and the phase-difference plate array 90 correspond to a specific example of the "optical path unifying section" in one embodiment of the present disclosure, and the polarization beam splitter 30D corresponds to a specific example of a "polarization splitter" in one embodiment of the present disclosure.

Figure 20:
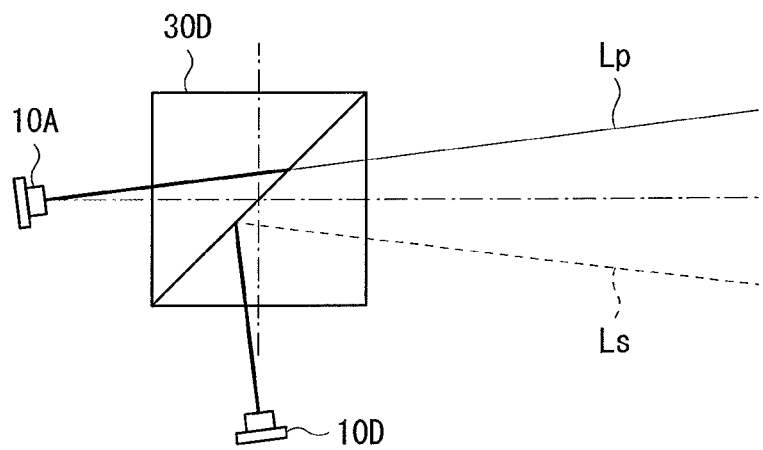
FIG. 20 is a diagram showing an example of working of a dichroic prism in FIGS. 19A to 19C.

The polarization beam splitter 30D is an optical device having anisotropy to polarization of entering light, and configured to separate (for example, reflect) light incident from the light sources 10A and 10D to cause an S-polarized component and a P-polarized component to travel in different directions. Specifically, as shown in FIG. 20 for example, the polarization beam splitter 30D is configured to selectively transmit light of the P-polarized component (P-polarized light Lp) included in light incident from the light source 10A to have the incidence angle and emission angle equal (or substantially equal) to each other. The polarization beam splitter 30D is configured to selectively reflect light of the S-polarized component (S-polarized light Ls) included in light incident from the light source 10D to have the incidence angle and emission angle different from each other. Here, it is preferable for the direction in which the P-polarized light Lp emitted from the polarization beam splitter 30D travels and the direction in which the S-polarized light Ls travels to be in opposition to each other in the relationship with the normal (optical axis) of the polarization beam splitter 30D and to be in the directions in axisymmetry in the relationship with the normal (optical axis).

It may also be possible for the polarization beam splitter 30D to be configured, for example, to selectively transmit light of the S-polarized component included in light incident from the light source 10A to have the incidence angle and the emission angle equal (or substantially equal) to each other, conversely to the example described above. In this case, it may also be possible for the polarization beam splitter 30D to be further configured, for example, to selectively reflect light of the P-polarized component included in light incident from the light source 10D to have the incidence angle and the emission angle different from each other.

Figure 21:
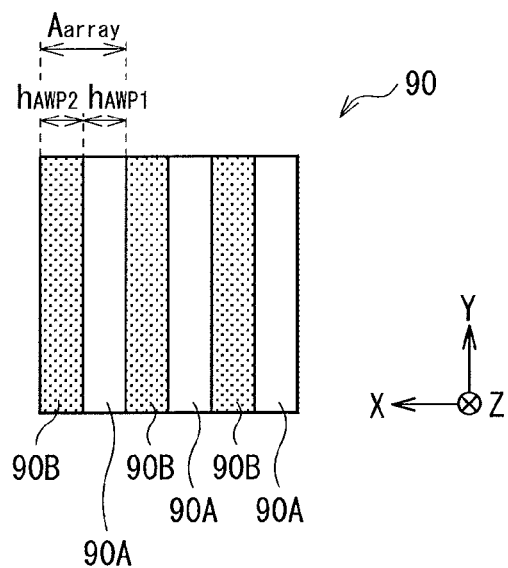
FIG. 21 is a diagram showing an outline configuration example of the phase-difference plate array in FIGS. 19A to 19C.

The phase-difference plate array 90 has, as shown in FIG. 21 for example, a first region 90A and a second region 90B, the phase differences of which are different from each other. The first region 90A is arranged in a position where a polarized component of one of the S-polarized component (S-polarized light Ls) and the P-polarized component (P-polarized light Lp) separated in the polarization beam splitter 30D enters, and configured to transmit light incident on the first region 90A in a state where the polarization direction is maintained. On the other hand, the second region 90B is arranged in a position where the polarized component, different from the polarized component incident on the first region 90A, of the S-polarized component (S-polarized light Ls) and the P-polarized component (P-polarized light Lp) separated in the polarization beam splitter 30D enters, and configured to convert light incident on the second region 90B into the same polarized light as the polarized light incident on the first region 90A. Both the first region 90A and the second region 90B are in the shape of a band extending in a direction perpendicular to the direction of the separation (reflection) in the polarization beam splitter 30D, and arranged alternately in a direction parallel with the direction of the separation (reflection) in the polarization beam splitter 30D. Here, when each cell of the fly-eye lenses 40A and 40B has an aspect ratio other than 1, it is preferable for both the first region 90A and the second region 90B to extend in a direction vertical to the lengthwise direction of the fly-eye lenses 40A and 40B.

A total width $A_{array}$ of the first region 90A and the second region 90B adjacent to each other is equal to, for example, the width of one cell 42 of the fly-eye lens 40B. When the first region 90A and the second region 90B are arranged in the horizontal direction as shown in FIG. 21 for example, the width $A_{array}$ is equal to, for example, the width ($h_{FEL2H}$) in the horizontal direction of the cell 42. When the first region 90A and the second region 90B are arranged in the vertical direction, although not shown, the width $A_{array}$ is equal to, for example, the width ($h_{FEL2V}$) in the vertical direction of the cell 42. A width $h_{AWP1}$ of the first region 90A and a width $h_{AWP2}$ of the second region 90B are, for example, equal to each other.

Figure 22:
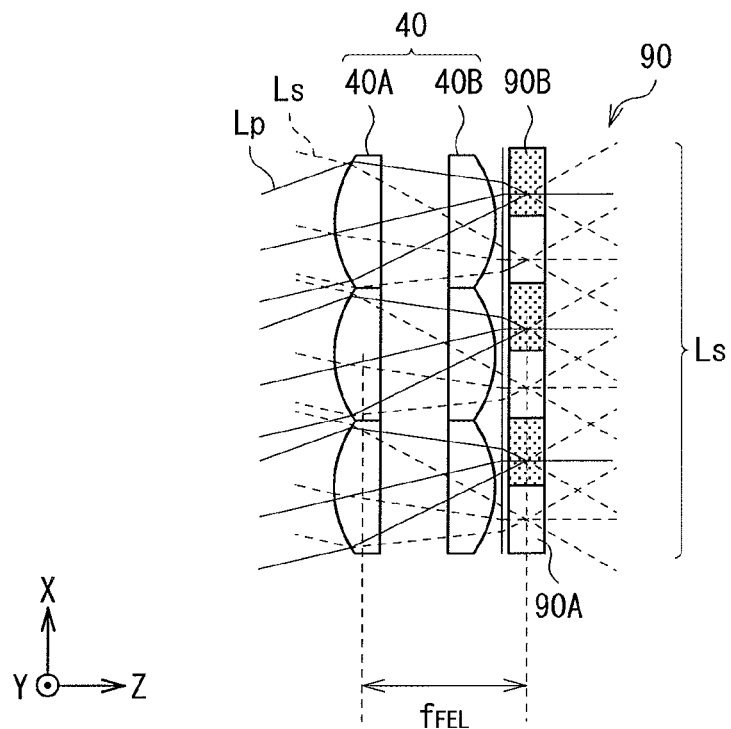
FIG. 22 is a diagram showing an example of working of an integrator and the phase-difference plate array in FIGS. 19A to 19C.

Due to such a configuration, in the light source unit 10-2, as shown in FIG. 22 for example, the S-polarized light Ls emitted from the polarization beam splitter 30D forms a plurality of minute light fluxes in the integrator 40 and enters the first region 90A of the phase-difference plate array 90. Then, the S-polarized light Ls incident on the first region 90A passes through the phase-difference plate array 90 and exits while maintaining the direction of the polarization thereof. On the other hand, the P-polarized light Lp emitted from the polarization beam splitter 30D forms a plurality of minute light fluxes in the integrator 40 and enters the first region 90B of the phase-difference plate array 90. Then, the P-polarized light Lp incident on the second region 90B is converted into the polarized light which is equal to the polarized light incident on the first region 90A (here, the S-polarized light Ls), and then emitted from the phase-difference plate array 90. Conversely to this example, it may also be possible for the P-polarized light Ls incident on the first region 90A to pass through the phase-difference plate array 90 and exit while maintaining the direction of the polarization thereof, and it may also be possible for the S-polarized light Ls incident on the second region 90B to be converted into the P-polarized light Lp then emitted from the phase-difference plate array 90. In either case, the phase-difference plate array 90 is configured to mainly emit polarized light of one of the P-polarized light Lp and the S-polarized light Ls (in the example in FIG. 22, the S-polarized light Ls).

Figure 23:
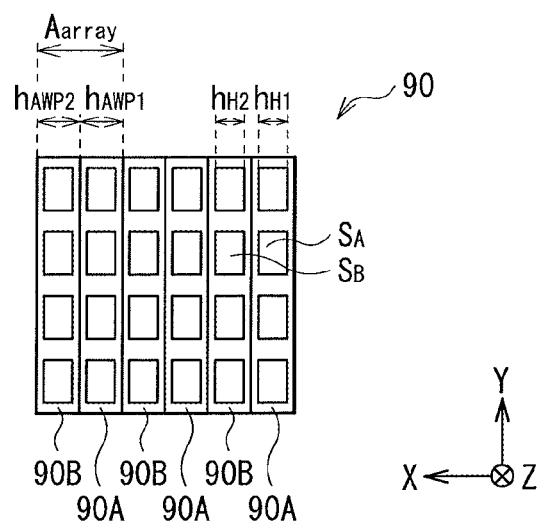
FIG. 23 is a schematic diagram representing an example of a light source image that appears on a fly-eye lens in a post stage in the integrator in FIGS. 19A to 19C.

Further, at this time, the S-polarized light Ls emitted from the polarization beam splitter 30D is split up into minute light fluxes in the fly-eye lens 40A, and each split-up light flux forms a focal point in the vicinity of the first region 90A of the phase-difference plate array 90 and forms thereat a secondary light source plane (light source image $S_A$) (see FIG. 23). Similarly, the P-polarized light Lp emitted from the polarization beam splitter 30D is split up into minute light fluxes in the fly-eye lens 40A, and each split-up light flux forms a focal point in the vicinity of the second region 90B of the phase-difference plate array 90 and forms thereat a secondary light source plane (light source image $S_B$) (see FIG. 23).

In the projector in the present embodiment including the illumination optical system having the light source unit 10-2 and the phase-difference plate array 90 with such a configuration, it is also possible to obtain effect similar to that of the projector 1 in the first embodiment described above due to the similar working.

[Modifications]

Subsequently, modifications (modifications 1 and 2) common to the first and second embodiments described above are described. The same symbols are attached to the same components as those in these embodiments and their explanation will be omitted appropriately.

[Modification 1]

Figures 24A, 24B:
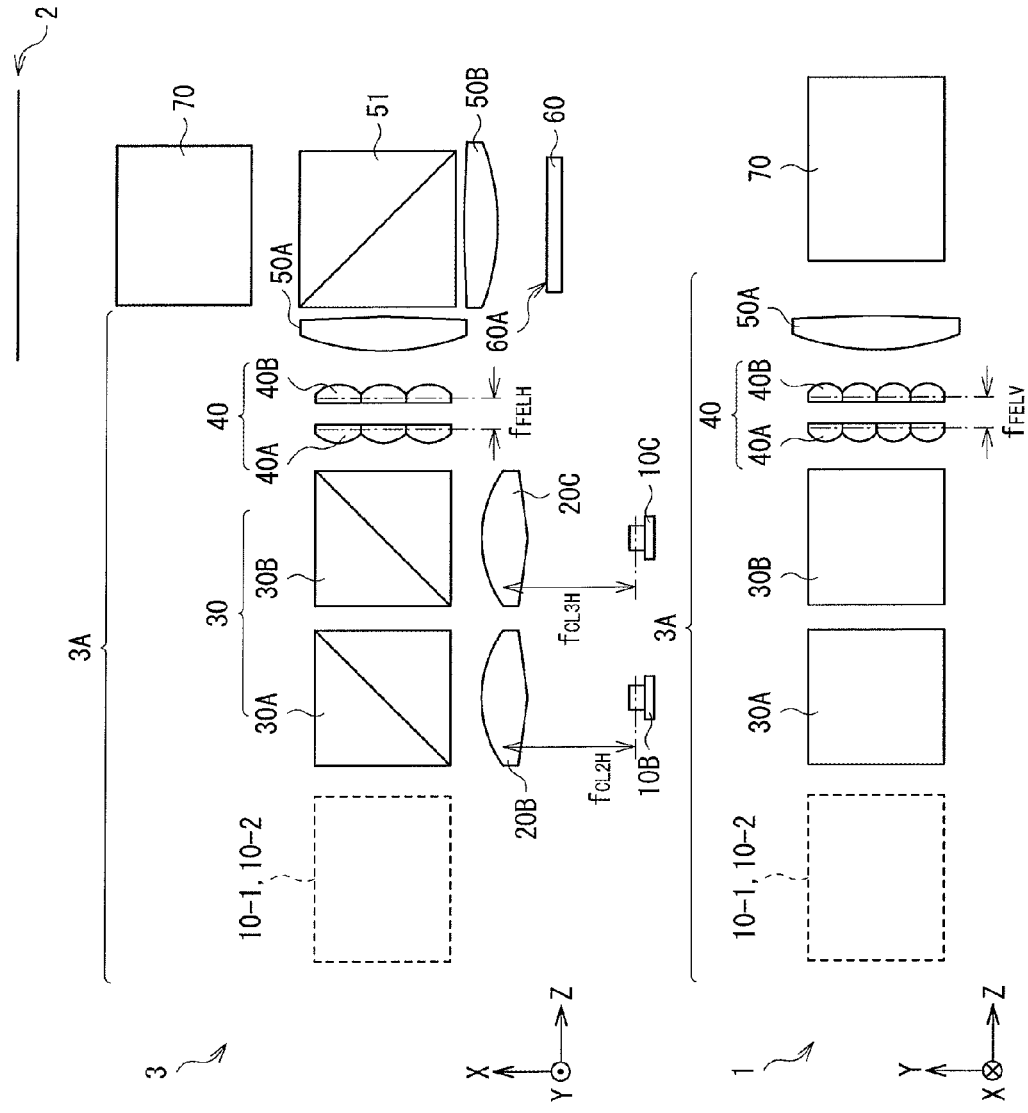
FIGS. 24A and 24B are diagrams each representing an outline configuration of a projector according to modification 1.

FIGS. 24A and 24B represent an outline configuration of a projector (projector 3) according to modification 1. The projector 3 corresponds to a specific example of the "projection display unit" of the present disclosure. Here, FIG. 24A shows a configuration example when the projector 3 is viewed from above (in the y-axis direction) and FIG. 24B shows a configuration example when the projector 3 is viewed from the lateral side (in the x-axis direction).

The configuration of the projector 3 in the present modification differs from the configuration of the projector 1 including the illumination optical system 1A, in that an illumination optical system 3A is included, and a reflection type device is used as the spatial modulation device 60. In the following, the points different from the projector 1 are explained mainly and explanation of the points common to the projector 1 will be omitted appropriately. In the illumination optical system 3A in the present modification, it may be possible to provide either of the light source units 10-1 and 10-2.

The illumination optical system 3A is a system in which a condenser lens 50A is provided in place of the condenser lens 50 in the illumination optical system 1A. The condenser lens 50A is a lens configured to turn light fluxes from a multiple light source formed by the integrator 40 into parallel light fluxes and illuminate a condenser lens 50B via a polarization beam splitter 51.

As described above, in the present modification, the spatial modulation device 60 is configured by, for example, a reflection type device, such as a reflection type liquid crystal panel. Consequently, compared to the projector 1, the projector 3 further includes the condenser lens 50B and the polarization beam splitter 51. The polarization beam splitter 51 is an optical member configured to selectively transmit a specific polarized light (for example, p-polarized light), and to selectively reflect other polarized light (for example, s-polarized light). The spatial modulation device 60 is configured to modulate light while reflecting light to cause each polarized light (for example, the s-polarized light or p-polarized light) at the time of incidence and at the time of emission to differ from each other. Due to this, light (for example, the s-polarized light) incident from the illumination optical system 3A is selectively reflected and caused to enter the spatial modulation device 60, and image light (for example, the p-polarized light) emitted from the spatial modulation device 60 passes through selectively and enters the side of the projection optical system 70. The condenser lens 50B is a lens configured to gather light fluxes from a multiple light source which are formed by the integrator 40 and entered via the condenser lens 50A and the polarization beam splitter 51, and to illuminate the illumination region 60 in an overlapping manner.

In the projector 3 in the present modification having such a configuration, it is also possible to obtain effect similar to that of the projector in the first and second embodiments described above due to the similar working.

In particular, in the present modification in particular, the length in the x-axis direction is particularly increased in the plane (xy plane) perpendicular to the optical axis of the integrator 40. Therefore, it is possible to say that the advantage of making an attempt to downsize the whole of the projector 3 is great by causing the direction of the minor axis (y-axis direction) in the unit outer shape of the projector 3 and the direction of the minor axis of FFP in light emitted from each of the light-emitting spots 11B to agree with each other.

[Modification 2]

FIGS. 25A and 25B represent an outline configuration of a projector (projector 4) according to modification 2. The projector 4 corresponds to a specific example of the "projection display unit" in one embodiment of the present disclosure. Here, FIG. 25A shows a configuration example when the projector 4 is viewed from above (in the y-axis direction) and FIG. 25B shows a configuration example when the projector 4 is viewed from the lateral side (in the x-axis direction).

The configuration of the projector 4 in the present modification differs from the configuration of the projector 1 including the illumination optical system 1A, in that an illumination optical system 4A is included. In the following, the points different from the projector 1 are explained mainly and explanation of the points common to the projector 1 will be omitted appropriately. In the illumination optical system 4A in the present modification, it may also be possible to provide either of the light source units 10-1 and 10-2.

The illumination optical system 4A has a configuration in which the integrator 40 and the condenser 50 are omitted (not provided) in the illumination optical system 1A. That is, the illumination optical system 4A has the light source unit 10-1 (or the light source unit 10-2), the light sources 10B and 10C, the coupling lenses 20B and 20C, and the optical path unifying device 30.

As described above, it may also be possible to not provide the integrator 40 or the condenser 50 within the illumination optical system as the case may be.

[Other Modifications]

The present disclosure is explained using the embodiments and modifications as examples as above, however, the present disclosure is not limited to these embodiments etc. and there may be various kinds of modifications.

For example, in the embodiments etc. described above, the configuration is such that the illumination optical systems 1A, 3A, and 4A include an infinite optical system configured to cause parallel light to enter the fly-eye lens 40A, however, it may also be possible to include a finite optical system configured to cause convergent light (or divergent light) to enter the fly-eye lens 40A in the configuration. In this case, it is sufficient to arrange a traveling-direction angle conversion device having a function of causing light emitted from the light sources 10A to 10C to converge or diverge in place of the coupling lenses 20B and 20C in the embodiments etc. described above. However, in this case, it is preferable for the optical magnification of the optical system including the above-mentioned traveling-direction angle conversion device and the fly-eye lenses 40A and 40B to be set so as to prevent the size of each of the light source images S formed on the fly-eye lens 40B by each cell 41 of the fly-eye lens 40A from exceeding the size of one cell 42 of the fly-eye lens 40B. Specifically, it is preferable for the optical magnification of the optical system including the traveling-direction angle conversion device and the fly-eye lenses 40A and 40B to satisfy the following relational expression. In this case also, when each of the cells 41 and 42 of the fly-eye lenses 40A and 40B has an aspect ratio other than 1, it is preferable for the illumination optical systems 1A, 3A, and 4A to be an anamorphic optical system.

$$h = P \times m \le h_{FEL2}$$

m: optical magnification of the optical system including the above-mentioned traveling-direction angle conversion device and the fly-eye lenses 40A and 40B.

Figure 26:
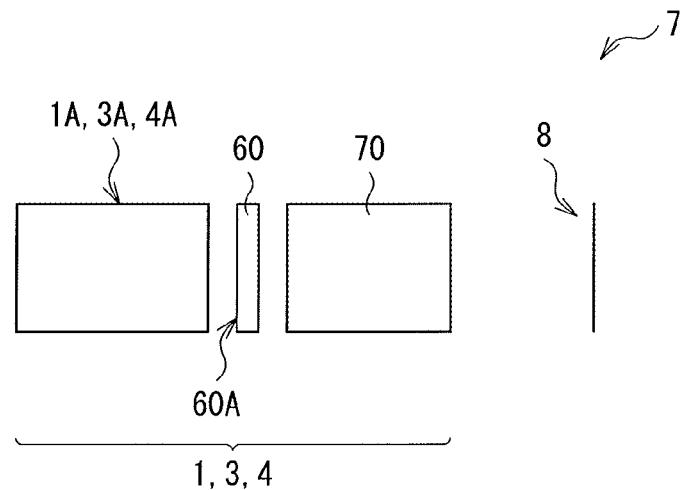
FIG. 26 is a diagram representing an outline configuration example of a rear projection display unit using the illumination optical system in any one of the embodiments and the modifications described above.

Also, the embodiments and the modifications described above are each applied to the projection display unit. However, it is possible to apply the embodiments and the modifications described above to other display unites. For example, as shown in FIG. 26, it is possible to apply the embodiments and the modifications to a rear projection display unit 7. The rear projection display unit 7 includes any one of the projectors 1, 3, and 4 including the illumination optical systems 1A, 3A, and 4A, respectively, and a transmission type screen 8 configured to show image light projected from any one of the projectors 1, 3, and 4 (the projection optical system 70). It is possible to improve luminance of illumination light (image light, display light) by using any one of the illumination optical systems 1A, 3A, and 4A as the illumination optical system of the rear projection display unit 7 as described above.

Figure 27:
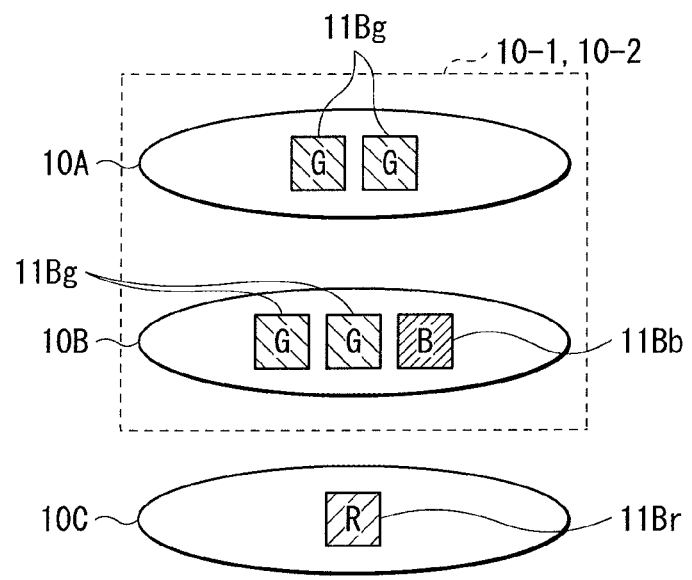
FIG. 27 is a schematic diagram showing an arrangement configuration example of a light-emitting spot of each color in each light source according to another modification.

Further, the method for arranging the light-emitting spots of each color in a plurality of light sources within the illumination optical system and the colors of light emitted from the light-emitting spot explained in the above-mentioned embodiments etc. are not limited in particular and it is possible to optionally set the method and colors according to uses and purposes. Even when the configuration is set as described above, it is possible to obtain effect similar to that in each of the embodiments described above due to the similar working. For example, in the example shown in FIG. 27, in each of the light sources 10A and 10B, the solid-state light-emitting device 11 has the two green light-emitting spots 11Bg. In the light source 10B, the solid-state light-emitting device 11 has the one blue light-emitting spot 11Bb, and further, in the light source 10C, the solid-state light-emitting device 11 has the one red light-emitting spot 11Br. Further, the optical path unifying section configured to unify light (here, green light) in the same wavelength band emitted from the two or more light sources (here, the two light sources 10A and 10B) described earlier, respectively, is provided within the light source unit 10-1 or the light source unit 10-2. That is, in the example shown in FIG. 27 in particular, in at least one light source of the two or more light sources (here, the two light sources 10A and 10B) described above, the solid-state light-emitting device 11 further has one or a plurality of light-emitting spots (here, the one blue light-emitting spot 11Bb) configured to emit light (here, blue light) in a wavelength band different from the same wavelength band (here, the wavelength band of green light).

In addition, in the above-mentioned embodiments etc., the spatial modulation device 60 includes the transmission type or reflection type device. However, this is not limited and it may also be possible for the spatial modulation device 60 to include a digital micromirror device.

Further, the embodiments etc. have been described with specific reference to each of the components (optical system) of the illumination optical system and the display unit. However, it is not necessary to include all the components and it may also be possible to further include other components.

Furthermore, the use of the illumination unit is directed to the display unit such as the projection type display unit in each of the embodiments etc. However, this is not limited and the embodiments and the modifications may be applied to an exposure unit such as a stepper.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention is claimed as follows:

1. An illumination unit comprising:
   a plurality of light sources each including a solid-state light-emitting device configured to emit light from a light emission region including a single or a plurality of light-emitting spots; and
   an optical member having a minor axis and a major axis, and allowing incident light from the solid-state light-emitting device to pass therethrough,
   wherein the solid-state light-emitting device includes a single chip or a plurality of chips each emitting a light beam,
   wherein three or more of the light-emitting spots are provided within the whole light sources, to allow the whole light sources to emit light beams in two or more wavelength bands different from one another,
   wherein two or more of the plurality of the light sources include respective light-emitting spots which emit light in a same wavelength band,
   wherein one or more of the chips in the whole light sources include a laser diode, wherein the chip configured of the laser diode, in at least one of the plurality of light sources, includes a plurality of light-emitting spots, and
   wherein directions of far field patterns (FFP) in light emitted from each of the light-emitting spots substantially agree with each other in an optical path of the optical member.

2. The illumination unit according to claim 1, wherein at least one of the two or more light sources further include one or more light-emitting spots each emitting light in a wavelength band different from the same wavelength band.

3. The illumination unit according to claim 1, further comprising an optical path unifying section configured to unify light beams in the same wavelength band emitted from the two or more light sources, respectively.

4. The illumination unit according to claim 3, wherein the optical path unifying section includes:
   one or more traveling-direction angle conversion device each converting a traveling-direction-angle of light entering from the two or more light sources;
   an integrator uniformalizing illumination distribution in a predetermined illumination region which is to be illuminated by light from the traveling-direction angle conversion device;
   polarization splitter provided between the two or more light sources and the integrator; and
   phase-difference plate array provided between the integrator and the illumination region, wherein
   the polarization splitter splits the light in the same wavelength band, which enters from the two or more light sources, into S-polarization component and P-polarization component which travel in directions different from each other,
   the phase-difference plate array includes first regions and second regions whose phase differences are different from each other,
   each of the first regions is disposed in a position where either one of the S- and P-polarization components split by the polarization splitter enters, and allows light entering the first region to transmit therethrough with maintaining the polarization direction, and
   each of the second regions is disposed in a position where the other of the S- and P-polarization components enters, and converts light, which enters the second region, into polarized light having the same polarization direction of the light which enters the first region.

5. The illumination unit according to claim 3, wherein the optical path unifying section includes a prism configured to redirect light travelling in different directions from the two or more light sources into a common optical path direction.

6. The illumination unit according to claim 1, wherein the optical member includes:
   one or more traveling-direction angle conversion device each converting a traveling-direction-angle of the light entering from the solid-state light-emitting device; and
   an integrator having a minor axis and a major axis and uniformalizing illumination distribution in a predetermined illumination region which is to be illuminated by light from the traveling-direction angle conversion device, wherein
   the direction of the minor axis of the FFP substantially agrees with a direction of a minor axis of the integrator in a plane perpendicular to an optical axis of the integrator.

7. The illumination unit according to claim 1, further comprising:
   one or more traveling-direction angle conversion device each converting a traveling-direction-angle of the light entering from the solid-state light-emitting device; and
   an integrator uniformalizing illumination distribution in a predetermined illumination region which is to be illuminated by light from the traveling-direction angle conversion device.

8. The illumination unit according to claim 7, wherein the integrator includes a first fly-eye lens having cells which receive light from the traveling-direction angle conversion device, and a second fly-eye lens having cells which receive light from the first fly-eye lens, and an optical system configured with the traveling-direction angle conversion device and the first and second fly-eye lenses has an optical magnification which allows each of light source images to have a size not exceeding a size of the cell in the second fly-eye lens, the light source images being formed on the second fly-eye lens by the respective cells in the first fly-eye lens.

9. The illumination unit according to claim 8, wherein the optical magnification of the optical system satisfies the following expression:

$$h = P \times m \leq h_{FEL2}$$

where h is the size of the light source image,
P is a size of the light emission region, the size being equal to a size of a light-emission spot of the chip when the solid-state light-emitting device is configured of one chip, and the size being equal to a size of an enclosure which encloses light-emission spots of all chips with a minimum inner area when the solid-state light-emitting device is configured of a plurality of chips, m is the optical magnification of the optical system, and $h_{FEL2}$ is the size of the cell in the second fly-eye lens.

10. The illumination unit according to claim 8, wherein
the first fly-eye lens is disposed substantially in the focal position of the second fly-eye lens, and
the second fly-eye lens is disposed substantially in the focal position of the first fly-eye lens.

11. The illumination unit according to claim 1, wherein each of the light sources is formed in a manner of a package incorporating the solid-state light-emitting device.

12. The illumination unit according to claim 1, wherein each light source is formed in a manner of a package where the solid-state light-emitting device is mounted on a substrate.

13. The illumination unit according to claim 1, wherein the chip includes a light-emitting diode, an organic EL device, or a laser diode.

14. A projection display unit comprising:
an illumination optical system;
a spatial modulation device modulating light from the illumination optical system based on an input picture signal to generate imaging light; and
a projection optical system projecting the imaging light generated by the spatial modulation device,
the illumination optical system including a plurality of light sources each including a solid-state light-emitting device configured to emit light from a light emission region including a single or a plurality of light-emitting spots, and an optical member having a minor axis and a major axis, and allowing incident light from the solid-state light-emitting device to pass therethrough,
wherein the solid-state light-emitting device includes a single chip or a plurality of chips each emitting light beam,
wherein three or more of the light-emitting spots are provided within the whole light sources, to allow the whole light sources to emit light beams in two or more wavelength bands different from one another,
wherein two or more of the plurality of the light sources include respective light-emitting spots which emit light in a same wavelength band,
wherein one or more of the chips in the whole light sources include a laser diode, wherein the chip configured of the laser diode, in at least one of the plurality of light sources, includes a plurality of light-emitting spots, and
wherein directions of far field patterns (FFP) in light emitted from each of the light-emitting spots substantially agree with each other in an optical path of the optical member.

15. A direct view display unit comprising:
an illumination optical system;
a spatial modulation device modulating light from the illumination optical system based on an input picture signal to generate imaging light;
a projection optical system projecting the imaging light generated by the spatial modulation device; and
a transmissive screen displaying the imaging light projected from the projection optical system,
the illumination optical system including a plurality of light sources each including a solid-state light-emitting device configured to emit light from a light emission region including a single or a plurality of light-emitting spots, and an optical member having a minor axis and a major axis, and allowing incident light from the solid-state light-emitting device to pass therethrough,
wherein the solid-state light-emitting device includes a single chip or a plurality of chips each emitting light beam,
wherein three or more of the light-emitting spots are provided within the whole light sources, to allow the whole light sources to emit light beams in two or more wavelength bands different from one another,
wherein two or more of the plurality of the light sources include respective light-emitting spots which emit light in a same wavelength band,
wherein one or more of the chips in the whole light sources include a laser diode, wherein the chip configured of the laser diode, in at least one of the plurality of light sources, includes a plurality of light-emitting spots, and
wherein directions of far field patterns (FFP) in light emitted from each of the light-emitting spots substantially agree with each other in an optical path of the optical member.

* * * * *